(12) United States Patent
Tamaru et al.

(10) Patent No.: US 12,671,220 B2
(45) Date of Patent: Jun. 30, 2026

(54) OPTICAL PULSE STRETCHER, LASER APPARATUS, AND ELECTRONIC DEVICE MANUFACTURING METHOD

(71) Applicants: Gigaphoton Inc., Tochigi (JP); Inter-University Research Institute Corporation, National Institutes of Natural Sciences, Tokyo (JP)

(72) Inventors: Yuki Tamaru, Oyama (JP); Taisuke Miura, Oyama (JP); Ryo Yasuhara, Toki (JP)

(73) Assignees: Gigaphoton Inc., Tochigi (JP); Inter-University Research Institute Corporation, National Institutes of Natural Sciences, Tokyo (JP)

( * ) Notice: Subject to any disclaimer, the term of this patent is extended or adjusted under 35 U.S.C. 154(b) by 84 days.

(21) Appl. No.: 18/656,729

(22) Filed: May 7, 2024

(65) Prior Publication Data

US 2024/0291219 A1 Aug. 29, 2024

Related U.S. Application Data

(63) Continuation of application No. PCT/JP2021/044119, filed on Dec. 1, 2021.

(51) Int. Cl.
*G03F 7/20* (2006.01)
*G02B 17/02* (2006.01)
(Continued)

(52) U.S. Cl.
CPC .......... *H01S 3/0057* (2013.01); *G02B 17/023* (2013.01); *G02B 17/0663* (2013.01);
(Continued)

(58) Field of Classification Search
CPC ........ H01S 3/0057; H01S 3/225; H01S 3/005; H01S 3/2251; H01S 3/10; H01S 3/2366;
(Continued)

(56) References Cited

U.S. PATENT DOCUMENTS 6,067,311 A 5/2000 Morton et al.
2014/0346374 A1* 11/2014 Yanagida ................ G02F 1/093
359/333
(Continued)

FOREIGN PATENT DOCUMENTS

CN 107565360 A 1/2018
JP 2006-186046 A 7/2006
(Continued)

OTHER PUBLICATIONS

An Office Action; "Notice of Reasons for Refusal," mailed by the Japanese Patent Office on Jun. 23, 2025, which corresponds to Japanese Patent Application No. 2023-564342 and is related to U.S. Appl. No. 18/656,729; with English language translation.
(Continued)

*Primary Examiner* — Mesfin T Asfaw
(74) *Attorney, Agent, or Firm* — Studebaker Brackett PLLC

(57) ABSTRACT

An optical pulse stretcher that stretches a pulse width of a pulse laser beam includes a polarizer configured to separate a component in a specific polarization direction of the pulse laser beam that has entered, a delay optical system including a plurality of mirrors through which the pulse laser beam reflected by or transmitted through the polarizer is propagated; and a first Faraday rotator that includes a first magnet and a first Faraday material and is disposed on an optical path of the delay optical system to rotate a polarization direction of the pulse laser beam.

20 Claims, 21 Drawing Sheets

(51) Int. Cl.

| | |
|---|---|
| *G02B 17/06* | (2006.01) |
| *G02B 27/28* | (2006.01) |
| *G02F 1/01* | (2006.01) |
| *G02F 1/09* | (2006.01) |
| *G03F 7/00* | (2006.01) |
| *H01S 3/00* | (2006.01) |
| *H01S 3/225* | (2006.01) |

(52) U.S. Cl.
CPC ......... *G02B 27/288* (2013.01); *G02F 1/0136* (2013.01); *G02F 1/092* (2013.01); *G03F 7/2008* (2013.01); *G03F 7/70025* (2013.01); *G03F 7/70041* (2013.01); *G03F 7/70566* (2013.01); *H01S 3/225* (2013.01)

(58) Field of Classification Search
CPC ........................ G02B 17/023; G02B 17/0663; G02B 27/288; G02F 1/0136; G02F 1/092; G02F 1/09; G03F 7/2008; G03F 7/70025; G03F 7/70041; G03F 7/70566
See application file for complete search history.

(56) References Cited

U.S. PATENT DOCUMENTS

| | | |
|---|---|---|
| 2019/0372299 A1 | 12/2019 | Kabeya et al. |
| 2021/0050213 A1* | 2/2021 | Savas ................ H01J 37/32119 |
| 2022/0350120 A1 | 11/2022 | Miyamoto et al. |

FOREIGN PATENT DOCUMENTS

| | | |
|---|---|---|
| JP | 2019-207989 A | 12/2019 |
| WO | 2020/038707 A1 | 2/2020 |
| WO | 2020/256885 A1 | 12/2020 |
| WO | 2021/171516 A1 | 9/2021 |

OTHER PUBLICATIONS

International Search Report issued in PCT/JP2021/044119; mailed Jan. 18, 2022.
International Preliminary Report on Patentability and Written Opinion issued in PCT/JP2021/044119; issued May 2, 2024.

* cited by examiner

Fig. 10

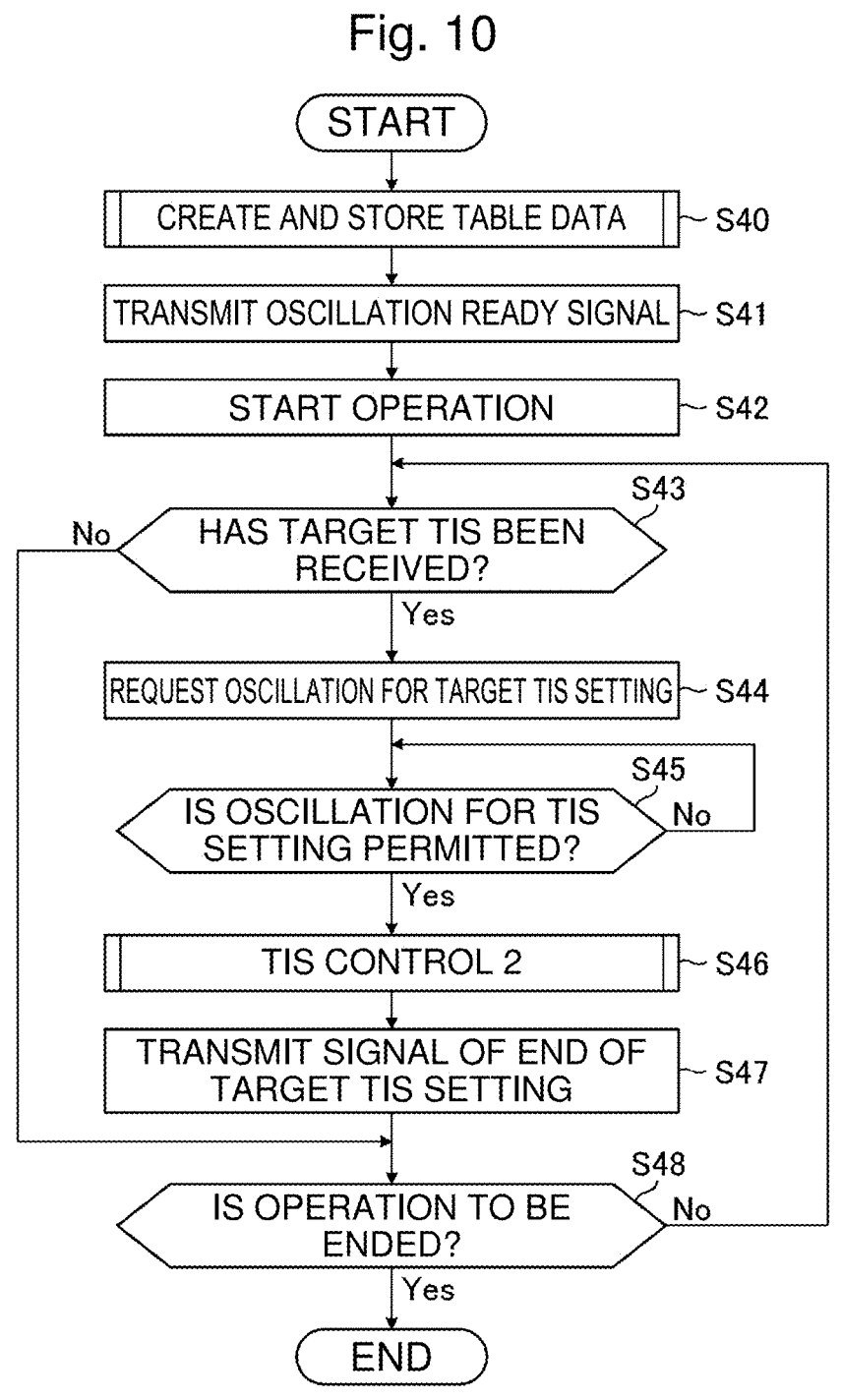

```
                    ( START )
                        │
                        ▼
      ┌───────────────────────────────────┐
      │  CREATE AND STORE TABLE DATA      │── S40
      └───────────────────────────────────┘
                        │
                        ▼
      ┌───────────────────────────────────┐
      │  TRANSMIT OSCILLATION READY SIGNAL│── S41
      └───────────────────────────────────┘
                        │
                        ▼
      ┌───────────────────────────────────┐
      │         START OPERATION           │── S42
      └───────────────────────────────────┘
                        │
                        ▼
                                         S43
              ╱─────────────────────────╲
      No ────〈   HAS TARGET TIS BEEN     〉
              ╲       RECEIVED?          ╱
                ╲───────────────────────╱
                        │ Yes
                        ▼
      ┌───────────────────────────────────┐
      │REQUEST OSCILLATION FOR TARGET TIS SETTING│── S44
      └───────────────────────────────────┘
                        │
                        ▼
                                         S45
              ╱─────────────────────────╲
             〈  IS OSCILLATION FOR TIS   〉── No
              ╲  SETTING PERMITTED?      ╱
                ╲───────────────────────╱
                        │ Yes
                        ▼
      ┌───────────────────────────────────┐
      │         TIS CONTROL 2             │── S46
      └───────────────────────────────────┘
                        │
                        ▼
      ┌───────────────────────────────────┐
      │   TRANSMIT SIGNAL OF END OF       │── S47
      │       TARGET TIS SETTING         │
      └───────────────────────────────────┘
                        │
                        ▼
                                         S48
              ╱─────────────────────────╲
             〈    IS OPERATION TO BE     〉── No
              ╲       ENDED?             ╱
                ╲───────────────────────╱
                        │ Yes
                        ▼
                    (  END  )
```

OPTICAL PULSE STRETCHER, LASER APPARATUS, AND ELECTRONIC DEVICE MANUFACTURING METHOD

CROSS-REFERENCE TO RELATED APPLICATIONS

The present application is a continuation application of International Application No. PCT/JP2021/044119, filed on Dec. 1, 2021, the entire contents of which are hereby incorporated by reference.

BACKGROUND

1. Technical Field

The present disclosure relates to an optical pulse stretcher, a laser apparatus, and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser apparatus for exposure, a KrF excimer laser apparatus that outputs a laser beam having a wavelength of about 248 nm and an ArF excimer laser apparatus that outputs a laser beam having a wavelength of about 193 nm are used.

Spectral linewidths of spontaneous oscillation beams of the KrF excimer laser apparatus and the ArF excimer laser apparatus are as wide as from 350 μm to 400 μm. Therefore, when a projection lens is formed of a material that transmits ultraviolet light such as a KrF laser beam and an ArF laser beam, chromatic aberration may occur. As a result, the resolution may decrease. Given this, the spectral linewidth of the laser beam output from the gas laser apparatus needs to be narrowed to an extent that the chromatic aberration is ignorable. Therefore, in a laser resonator of the gas laser apparatus, a line narrowing module (LNM) including a line narrowing element (etalon or grating, etc.) may be provided in order to narrow the spectral linewidth. Hereinafter, a gas laser apparatus with a narrowed spectral linewidth is referred to as a line narrowing gas laser apparatus.

LIST OF DOCUMENTS

Patent Documents

Patent Document 1: U.S. Pat. No. 6,067,311
Patent Document 2: Japanese Unexamined Patent Application Publication No. 2006-186046

SUMMARY

An optical pulse stretcher according to one aspect of the present disclosure stretches a pulse width of a pulse laser beam, and includes a polarizer, a delay optical system, and a first Faraday rotator. The polarizer is configured to separate a component in a specific polarization direction of the pulse laser beam that has entered. The delay optical system includes a plurality of mirrors through which the pulse laser beam reflected by or transmitted through the polarizer is propagated. The first Faraday rotator includes a first magnet and a first Faraday material and is disposed on an optical path of the delay optical system to rotate a polarization direction of the pulse laser beam.

A laser apparatus according to another aspect of the present disclosure includes an oscillator and an optical pulse stretcher. The oscillator is configured to output a pulse laser beam. The optical pulse stretcher is configured to stretch a pulse width of the pulse laser beam. The optical pulse stretcher includes a polarizer configured to separate a component in a specific polarization direction of the pulse laser beam that has entered, a delay optical system including a plurality of mirrors through which the pulse laser beam reflected by or transmitted through the polarizer is propagated, and a first Faraday rotator that includes a first magnet and a first Faraday material and is disposed on an optical path of the delay optical system to rotate a polarization direction of the pulse laser beam.

An electronic device manufacturing method according to yet another aspect of the present disclosure includes generating a laser beam having a stretched pulse width with a laser apparatus, outputting the laser beam to an exposure apparatus, and exposing a photosensitive substrate to the laser beam in the exposure apparatus to manufacture an electronic device. The laser apparatus includes an oscillator configured to output a pulse laser beam, and an optical pulse stretcher configured to stretch a pulse width of the pulse laser beam. The optical pulse stretcher includes a polarizer configured to separate a component in a specific polarization direction of the pulse laser beam that has entered, a delay optical system including a plurality of mirrors through which the pulse laser beam reflected by or transmitted through the polarizer is propagated, and a first Faraday rotator that includes a first magnet and a first Faraday material and is disposed on an optical path of the delay optical system to rotate a polarization direction of the pulse laser beam.

BRIEF DESCRIPTION OF THE DRAWINGS

Some embodiments of the present disclosure will be described below, by way of example only, with reference to the accompanying drawings.

FIG. 10 is a flowchart illustrating a modification of TIS control in a laser apparatus according to Embodiment 1.

FIG. 13 schematically illustrates a configuration of a laser apparatus according to Modification 1 of Embodiment 1.

FIG. 15 schematically illustrates a configuration of a laser apparatus according to Embodiment 2.

FIG. 16 is an explanatory diagram illustrating an example of a polarization direction of a pulse laser beam entering a second Faraday rotator and a polarization direction of a pulse laser beam having passed through an OPS.

FIG. 19 schematically illustrates a configuration of a laser apparatus according to Modification 1 of Embodiment 2.

DESCRIPTION OF EMBODIMENTS

Contents

Figure 1:
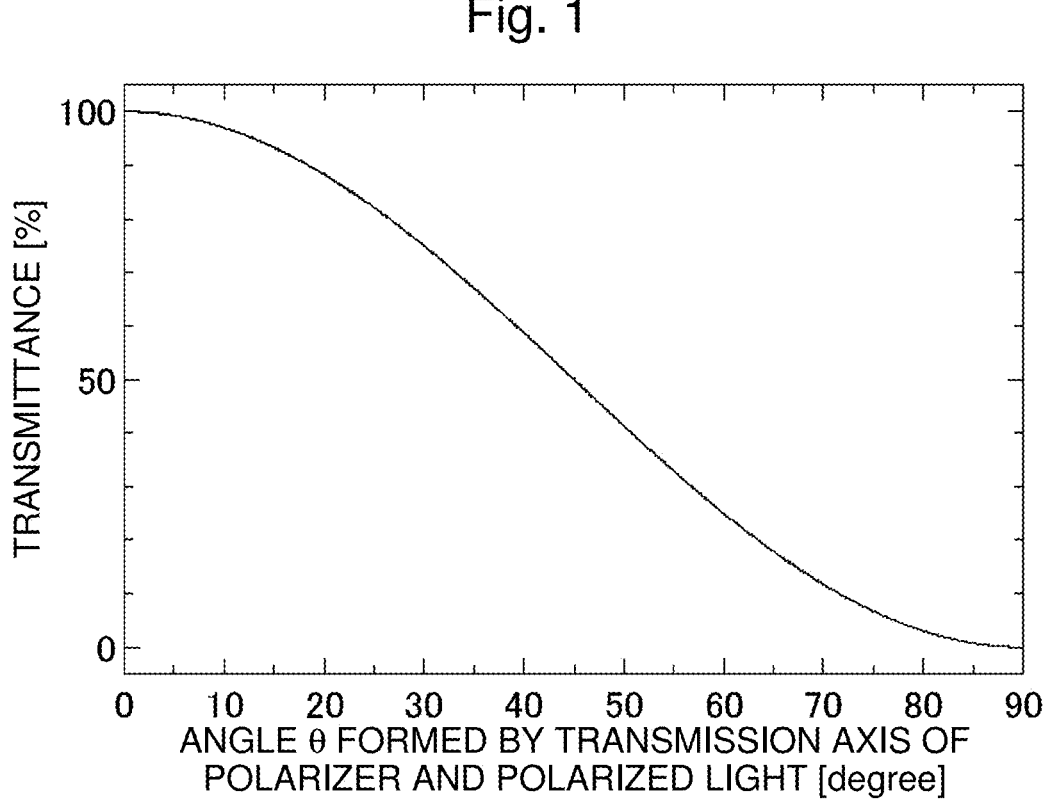
FIG. 1 is a graph illustrating an example of a relationship between an angle formed by a transmission axis of a polarizer and a polarization direction of incident light and a transmittance.

1. Terms
  1.1 Polarizer
  1.2 TIS (Time-Integral Square)
2. Overview of Laser Apparatus according to Comparative Example
  2.1 Configuration
  2.2 Operation
  2.3 Problem
3. Embodiment 1
  3.1 Configuration
  3.2 Operation
  3.3 Example 1 of Control Flow
  3.4 Example 2 of Control Flow
  3.5 Effect
  3.6 Modification 1
    3.6.1 Configuration
    3.6.2 Operation
    3.6.3 Effect
  3.7 Modification 2
    3.7.1 Configuration
    3.7.2 Operation
    3.7.3 Effect
4. Embodiment 2
  4.1 Configuration
  4.2 Operation
  4.3 Example of Control Flow
  4.4 Effect
  4.5 Modification 1
    4.5.1 Configuration
    4.5.2 Operation
    4.5.3 Effect
  4.6 Modification 2
    4.6.1 Configuration
    4.6.2 Operation
    4.6.3 Effect
5. Modification of Laser Apparatus
6. Electronic Device Manufacturing Method
7. Others Hereinafter, embodiments of the present disclosure will be described in detail with reference to the drawings. The embodiments described below show some examples of the present disclosure and do not limit contents of the present disclosure. In addition, all configurations and operations described in the embodiments are not necessarily essential as configurations and operations of the present disclosure. Here, the same components are denoted by the same reference numerals, and any redundant description thereof is omitted.

1. TERMS

1.1 Polarizer

A polarizer refers to an optical element that separates light having a specific polarization direction (transmission axis direction) from light having a polarization direction orthogonal thereto. When the polarization direction of the light is inclined by 0 degrees with respect to the transmission axis of the polarizer, each polarization component is separated by a ratio of equations below. A relationship of the equations below is called Malus' law.

$$I_T(\theta) = I\cos^2\theta \qquad \text{[Expression 1]}$$
$$I_R(\theta) = I - I\cos^2\theta = I\sin^2\theta$$

FIG. 1 is a graph illustrating an example of a relationship between an angle formed by a transmission axis of a polarizer and a polarization direction of incident light and a transmittance. In FIG. 1, a horizontal axis represents an angle $\theta$ formed by the transmission axis of the polarizer and polarized light, and a vertical axis represents the transmittance.

1.2 TIS (Time-Integral Square)

A TIS is an index representing a length of a pulse width of a laser beam, and is calculated from an equation below.

$$TIS = \frac{\left(\int I(t)\cdot dt\right)^2}{\int I(t)^2 dt} \qquad \text{[Expression 2]}$$

Here, I(t) represents light intensity per time.

2. OVERVIEW OF LASER APPARATUS ACCORDING TO COMPARATIVE EXAMPLE

2.1 Configuration

Figure 2:
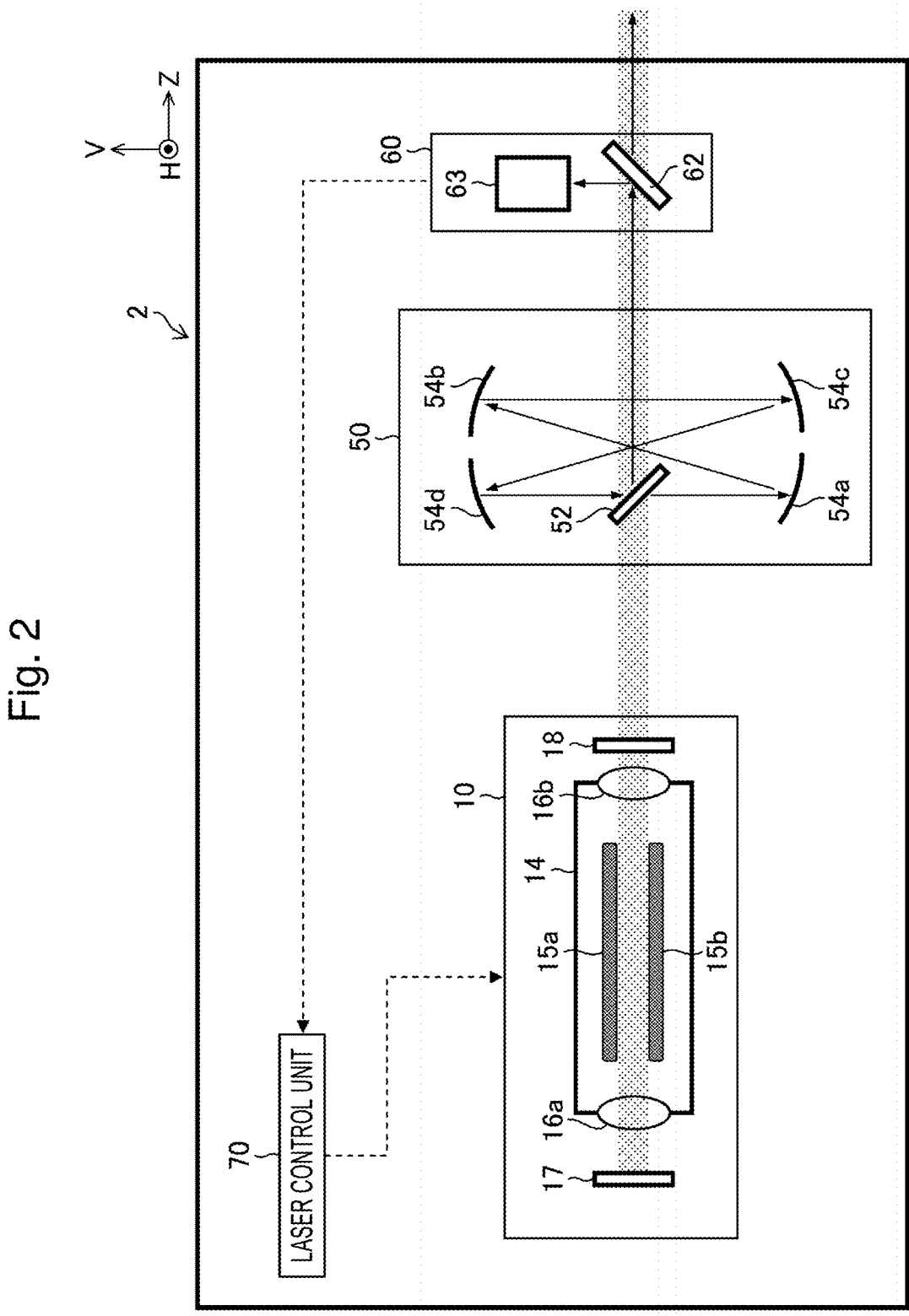
FIG. 2 schematically illustrates a configuration of a laser apparatus according to a comparative example.

FIG. 2 schematically illustrates a configuration of a laser apparatus 2 according to a comparative example. The comparative example of the present disclosure is an example recognized by the applicant as known only by the applicant, and is not a publicly known example admitted by the applicant. The laser apparatus 2 includes an oscillator 10, an optical pulse stretcher (OPS) 50, a monitor module 60, and a laser control unit 70.

The OPS 50 and the monitor module 60 are disposed in this order on an optical path of a pulse laser beam output from the oscillator 10. The oscillator 10 includes a chamber 14, a rear mirror 17, and an output coupling mirror 18. The output coupling mirror 18 and the rear mirror 17 are disposed to configure an optical resonator.

The chamber 14 is disposed on an optical path of the optical resonator, and includes a pair of discharge electrodes 15a and 15b and two windows 16a and 16b through which a laser beam is transmitted. An excimer laser gas is introduced into the chamber 14. The excimer laser gas may include, for example, an Ar gas or a Kr gas as a rare gas, a $F_2$ gas as a halogen gas, and a Ne gas as a buffer gas.

The OPS 50 includes a beam splitter 52 and concave mirrors 54a, 54b, 54c, and 54d, which form a delay optical path. The beam splitter 52 is disposed on an optical path of the laser beam, and is coated with a film that transmits a portion of incident pulse laser beam and reflects the other portion of the pulse laser beam. A reflectance of the beam splitter 52 is preferably about 60%. The beam splitter 52 causes the pulse laser beam transmitted through the beam splitter 52 to be output from the laser apparatus 2 as described above.

The concave mirrors 54a-54d have a substantially same focal length f. The concave mirrors 54a-54d are disposed to have a following relationship. That is, the concave mirrors 54a-54d are disposed such that an image of a laser beam reflected by the beam splitter 52 at a position of the beam splitter 52 is inverted by the concave mirror 54a and the concave mirror 54b and formed, then is returned to the beam splitter 52 again by the concave mirror 54c and the concave mirror 54d, and is normally rotated and formed. In this case, a delay optical path length L is 8f.

The monitor module 60 includes a beam splitter 62 and a photosensor 63. The photosensor 63 may be, for example, a biplanar discharge tube or a photodiode. Data measured using the photosensor 63 is transmitted to the laser control unit 70.

2.2 Operation

Based on control by the laser control unit 70, a high voltage pulse is applied between the discharge electrodes 15a and 15b in the chamber 14 from an unillustrated power supply. When discharge occurs between the discharge electrodes 15a and 15b in the chamber 14, a laser gas is excited, and a pulse laser beam having an ultraviolet wavelength from 150 nm to 380 nm is output from the output coupling mirror 18 by the optical resonator configured by the output coupling mirror 18 and the rear mirror 17.

The pulse laser beam output from the output coupling mirror 18 enters the OPS 50, and a portion of the pulse laser beam passes through the delay optical path in the OPS 50 two or more times so as to be stretched to a predetermined pulse width.

A portion of the pulse laser beam having passed through the OPS 50 is transmitted through the beam splitter 62 and is output from the laser apparatus 2. The other portion of the pulse laser beam having passed through the OPS 50 is reflected by the beam splitter 62 and enters the photosensor 63. Pulse energy E is measured by the photosensor 63, and obtained data is transmitted from the monitor module 60 to the laser control unit 70.

The laser control unit 70 controls a voltage of the high voltage pulse output from the unillustrated power supply so that a difference $\Delta E$ between target pulse energy Et and the measured pulse energy E approaches 0.

2.3 Problem

There are two methods of changing a pulse width or a pulse waveform stretched in the OPS 50, for example.

[Method 1] Changing a circulating optical path length

[Method 2] Changing a reflectance of the beam splitter 52

In Method 1, it is necessary to prepare in advance a plurality of kinds of standard products of OPS housings having different circulating optical path lengths. In Method 2, it is necessary to prepare in advance a plurality of kinds of standard products having different reflectances for the beam splitter 52. In addition, both Method 1 and Method 2 require replacement with the standard product, and replacement work needs a large amount of time and labor. Further, only a configuration of the prepared standard product can be changed, a degree of freedom of the change is low, and it is difficult to optimize the pulse width or the pulse waveform.

3. EMBODIMENT 1

3.1 Configuration

Figure 3:
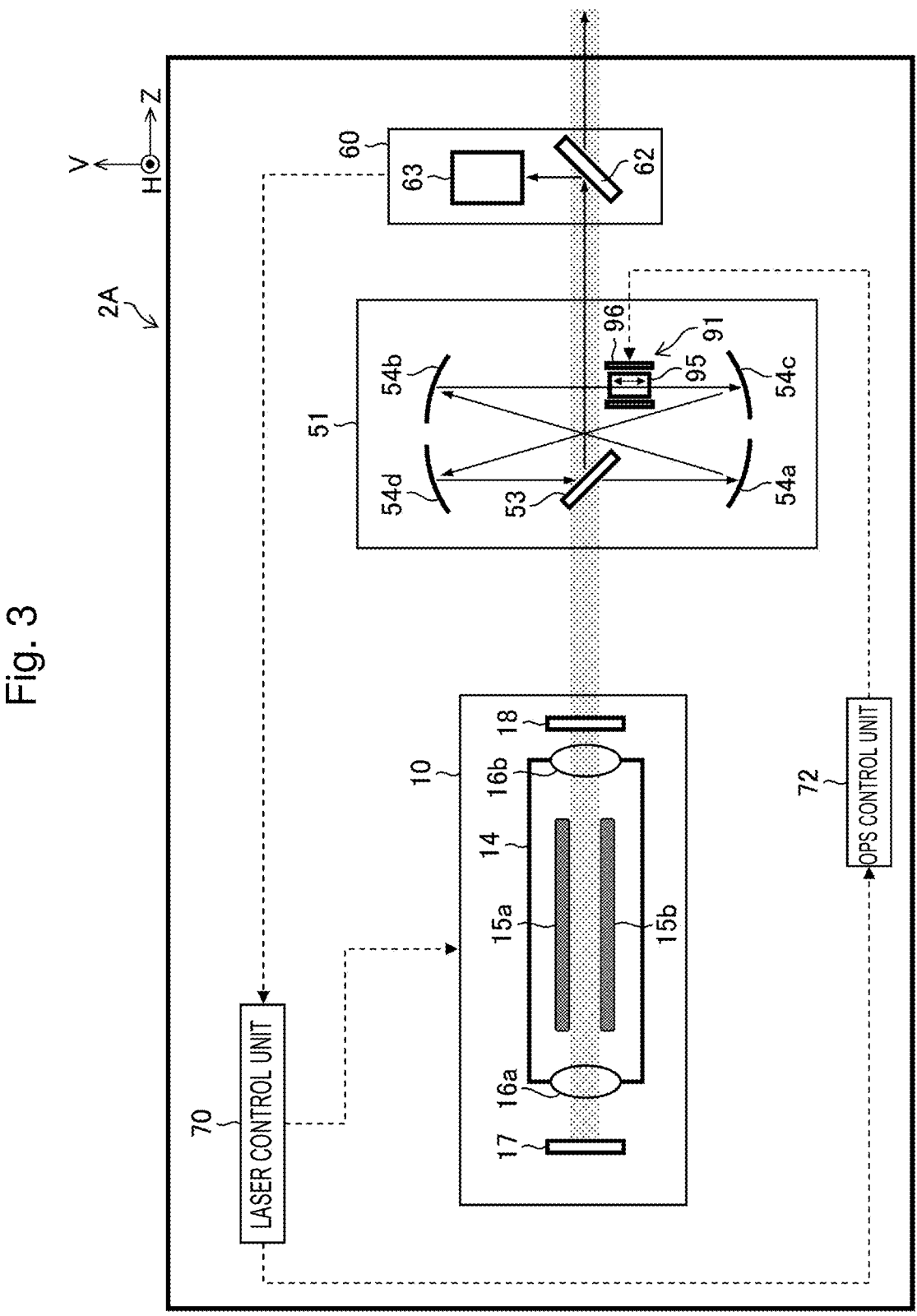
FIG. 3 schematically illustrates a configuration of a laser apparatus according to Embodiment 1.

FIG. 3 schematically illustrates a configuration of a laser apparatus 2A according to Embodiment 1. The laser apparatus 2A illustrated in FIG. 3 will be described in terms of differences from the configuration illustrated in FIG. 2.

The window 16b of the chamber 14 may be disposed, for example, at a Brewster's angle. The pulse laser beam output from the chamber 14 may be linearly polarized or randomly polarized.

The laser apparatus 2A includes an OPS 51 instead of the OPS 50 in FIG. 2. In the OPS 51, a Faraday rotator 91 is disposed on the delay optical path formed by the concave mirrors 54a-54d. The Faraday rotator 91 is disposed, for example, on an optical path between the concave mirror 54b and the concave mirror 54c. The Faraday rotator 91 may be disposed anywhere on the delay optical path. The Faraday rotator 91 is preferably disposed on an optical path of collimated light.

Further, instead of the beam splitter 52 in FIG. 2, a polarizer 53 is disposed in the OPS 51. The polarizer 53 is coated with a film that highly transmits P-polarized light and highly reflects S-polarized light.

The Faraday rotator 91 includes a Faraday material 95 and a magnet 96. The Faraday material 95 may be calcium fluoride ($CaF_2$) crystals or synthetic quartz. The magnet 96 may be a permanent magnet or an electromagnet.

Figure 4:
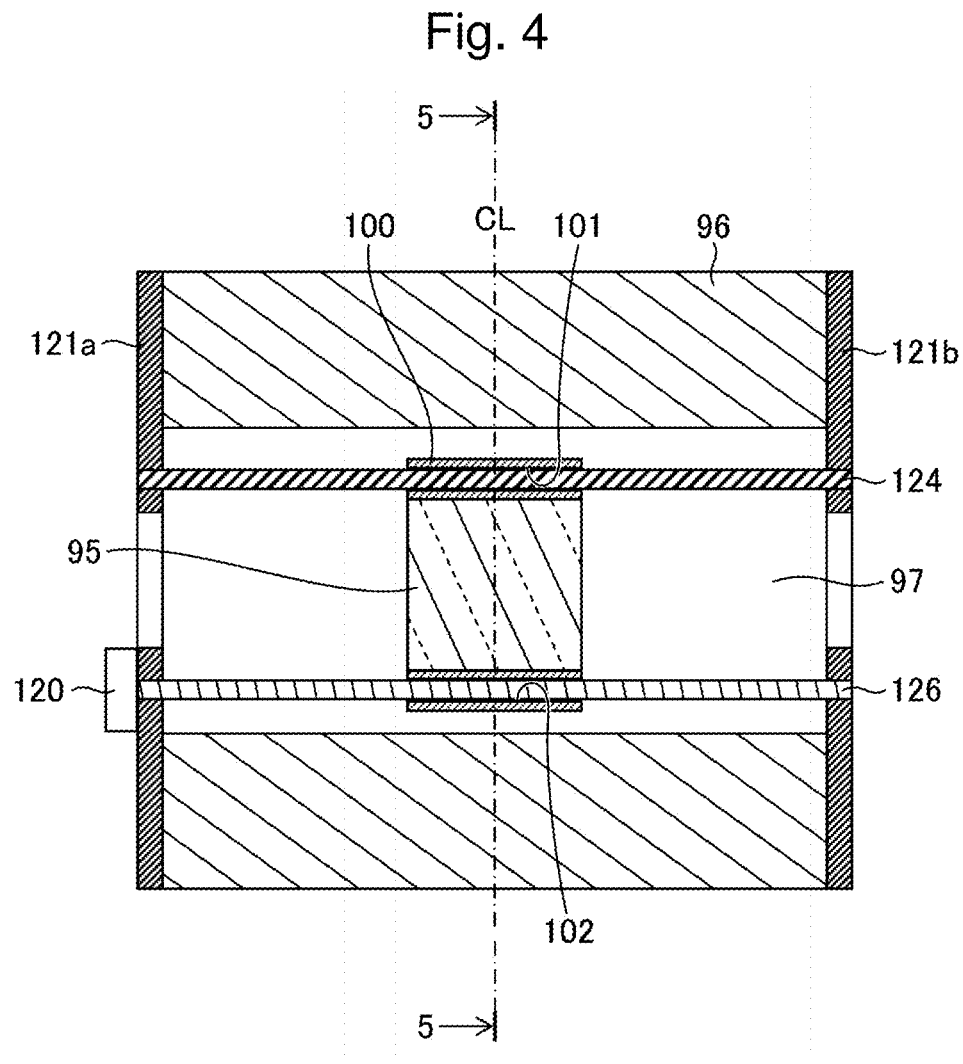
FIG. 4 is a cross-sectional view illustrating details of a configuration of a Faraday rotator.
Figure 5:
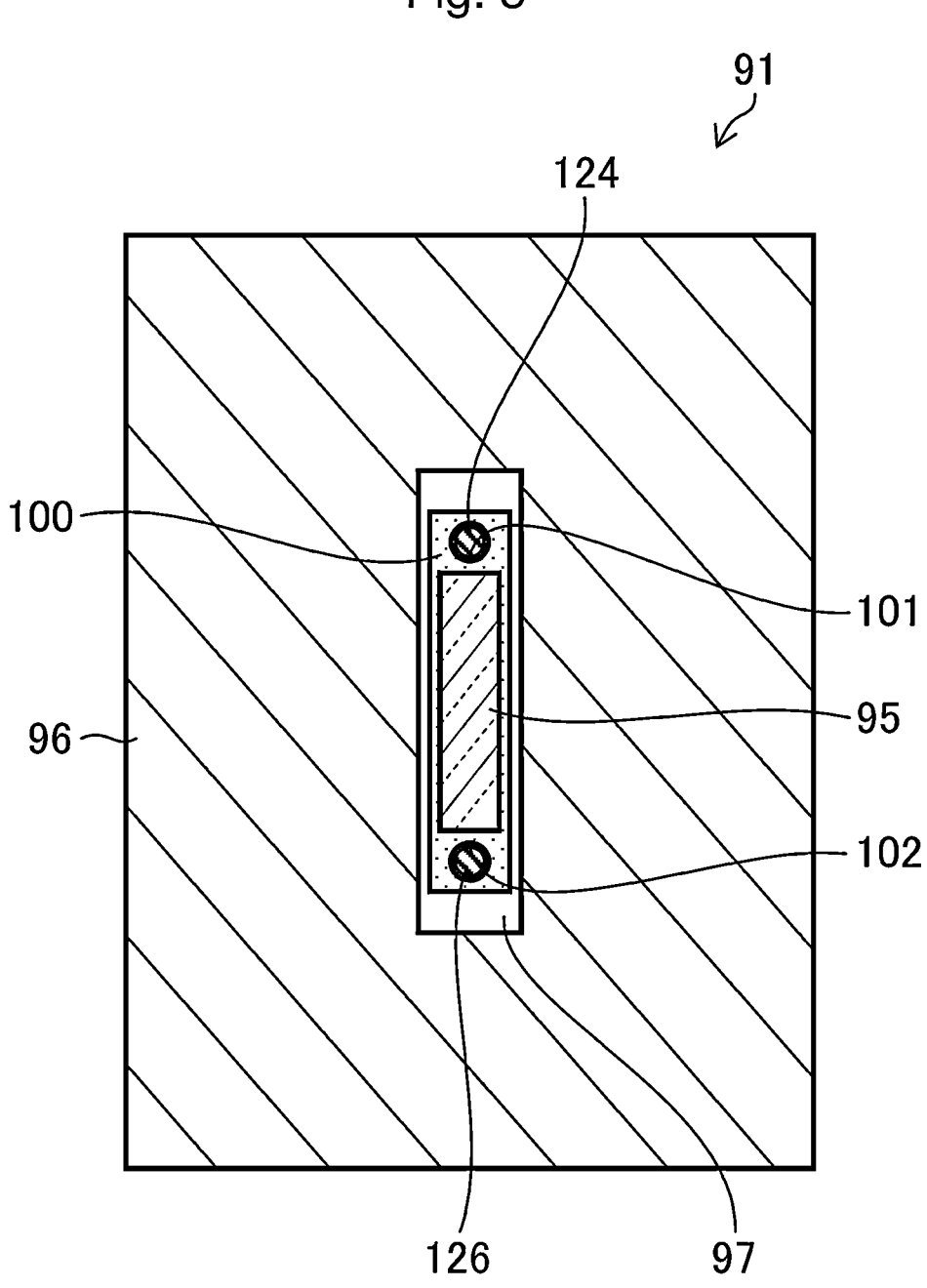
FIG. 5 is a cross-sectional view taken along a 5-5 line in FIG. 4.

FIG. 4 is a cross-sectional view illustrating details of a configuration of the Faraday rotator 91. FIG. 4 illustrates a cross section parallel to an optical axis of the pulse laser beam. A center line CL in FIG. 4 represents a center of the magnet 96. FIG. 5 is a cross-sectional view taken along a 5-5 line in FIG. 4.

An actuator 120 configured to control a rotation amount in a polarization direction is disposed in the Faraday rotator 91. The actuator 120 may be, for example, a mechanism that moves the Faraday material 95 with respect to the magnet 96 in an optical axis direction of the pulse laser beam. A movable amount (maximum moving amount) of the Faraday material 95 by the actuator 120 is preferably half or more of a length in the optical axis direction of the pulse laser beam of the Faraday material 95. A minimum moving unit of the Faraday material 95 by the actuator 120 may be, for example, about 0.2 mm. The actuator 120 may be configured to move the magnet 96 with respect to the Faraday material 95 in the optical axis direction of the pulse laser beam.

The Faraday rotator 91 is an example of "first Faraday rotator" in the present disclosure. The Faraday material 95 and the magnet 96 are examples of "first Faraday material" and "first magnet" in the present disclosure. The actuator 120 is an example of "first actuator" in the present disclosure.

The actuator 120 is not limited to a moving mechanism that relatively moves the Faraday material 95 and the magnet 96, and may be, for example, a mechanism that uses the magnet 96 as an electromagnet and controls a current flowing through the electromagnet, or a mechanism that uses a heater or the like to control a temperature of the magnet 96. In the present specification, a term "actuator" is used as a term of a concept including not only a device that performs a mechanical operation but also a structure (mechanism) that can change the rotation amount in the polarization direction by the Faraday rotator 91 by changing a current, a temperature, or the like.

Since a shape of a cross section perpendicular to the optical axis of the pulse laser beam is a longitudinally long rectangle, a cross-sectional shape of the Faraday material 95 may also be a longitudinally long rectangle. A cross-sectional shape of a magnetic field generating part 97 of the magnet 96 where the Faraday material 95 is disposed may be a longitudinally long rectangle in a same direction as the cross-sectional shape of the Faraday material 95.

The Faraday material 95 is disposed in the magnetic field generating part 97 of the magnet 96 while being held by a Faraday material holder 100. A shape of a cross section of the Faraday material holder 100 perpendicular to the optical axis of the pulse laser beam may be a longitudinally long rectangle similar to that of the Faraday material 95. The Faraday material holder 100 has a through-hole 101 formed at one end in a longitudinal direction of the longitudinally long rectangle and a female screw hole 102 formed at the other end.

A guide shaft 124 is inserted into the through-hole 101, and a rod-shaped male screw 126 is screwed into the female screw hole 102. The Faraday material holder 100 is held by a plate 121a and a plate 121b via the guide shaft 124 and the male screw 126. The male screw 126 is rotatably held and is connected to the actuator 120. The plate 121a and the plate 121b also hold the magnet 96. The actuator 120 is an example of "first moving mechanism" in the present disclosure.

Further, as illustrated in FIG. 3, the laser apparatus 2A includes an OPS control unit 72 that controls the actuator 120 in response to a measurement result of the photosensor 63. The OPS control unit 72 is connected to the laser control unit 70. The OPS control unit 72 may receive the measurement result of the photosensor 63 via the laser control unit 70.

Each of the laser control unit 70 and the OPS control unit 72 is configured using a processor. The processor of the present disclosure is a processing device including a storage device in which a control program is stored and a CPU (Central Processing Unit) that executes the control program. The processor is specifically configured or programmed to perform various kinds of processing included in the present disclosure. The processor may include an integrated circuit represented by an FPGA (Field Programmable Gate Array) or an ASIC (Application Specific Integrated Circuit). A processing function of the OPS control unit 72 may be incorporated in the laser control unit 70. Functions of the laser control unit 70 and the OPS control unit 72 may be implemented by one or more processors.

3.2 Operation

When a pulse laser beam polarized in a specific direction is transmitted through the Faraday material 95 to which a magnetic field is applied, the polarization direction is rotated. The rotation amount in the polarization direction of the pulse laser beam in the Faraday rotator 91 is determined by intensity of the magnetic field, a physical quantity such as a refractive index that the Faraday material 95 has, and a length of the Faraday material 95.

The intensity of the magnetic field of the magnetic field generating part 97 of the magnet 96 varies depending on a position in the optical axis direction. Therefore, by changing the position in the optical axis direction of the pulse laser beam of the Faraday material 95 with respect to the magnet 96 by the actuator 120, it is possible to control the rotation amount of polarization of the pulse laser beam in the Faraday rotator 91.

Of the pulse laser beam polarized in a specific direction and output from the oscillator 10, a component parallel to a transmission axis of the polarizer 53 is transmitted by the polarizer 53, and passes through the OPS 51. A component orthogonal to the transmission axis of the polarizer 53 is reflected by the polarizer 53 and is propagated through the delay optical path in the OPS 51.

Figure 6:
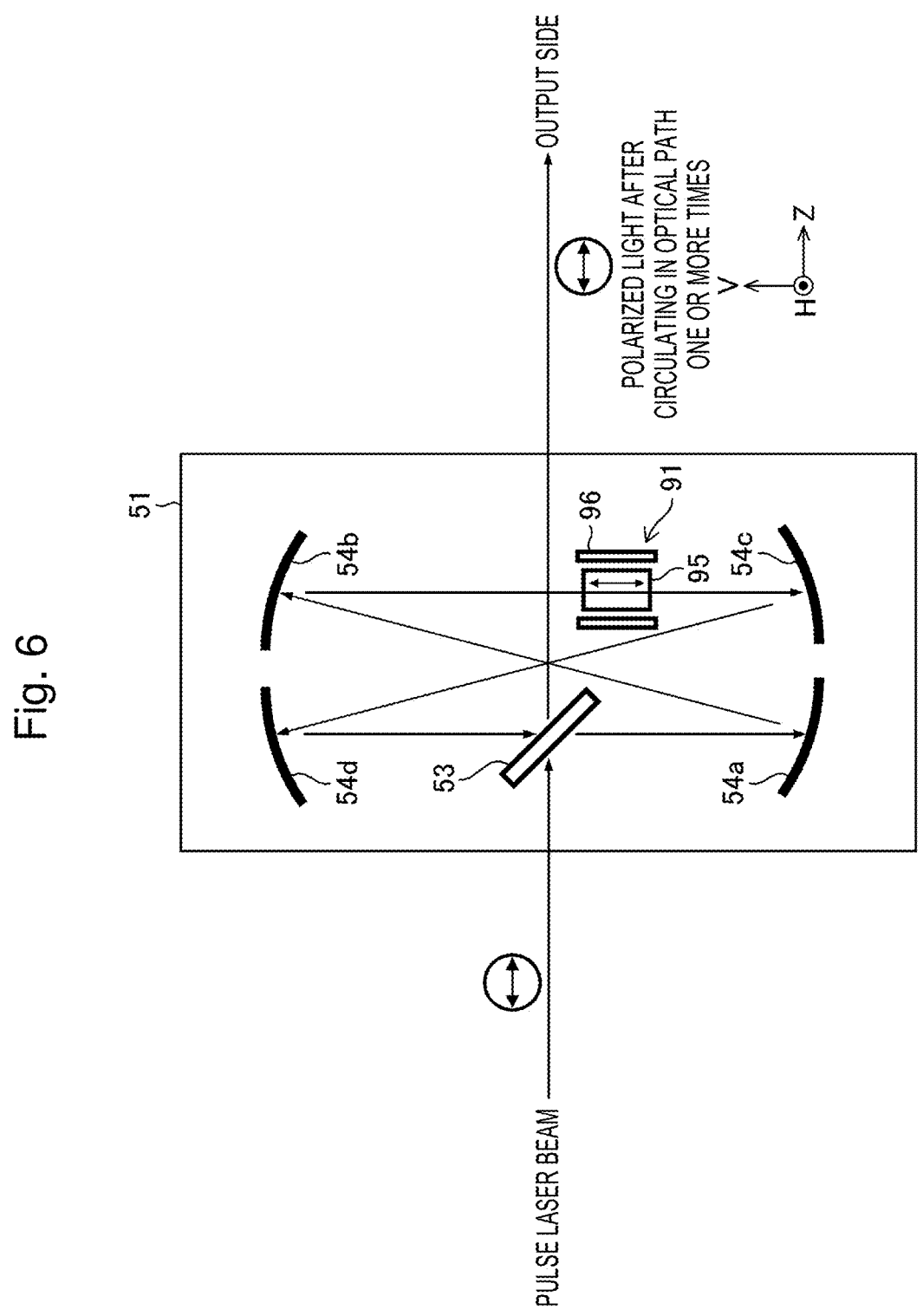
FIG. 6 is an explanatory diagram illustrating an example of a polarization direction of a pulse laser beam entering an optical pulse stretcher (OPS) and a polarization direction of a pulse laser beam having passed through the OPS.

FIG. 6 is an explanatory diagram illustrating an example of a polarization direction of a pulse laser beam entering the OPS 51 and a polarization direction of a pulse laser beam having passed through the OPS 51. A double arrow indicated in a circle in FIG. 6 represents the polarization direction of the pulse laser beam. FIG. 6 illustrates the polarization direction of the pulse laser beam when viewed in a propagation direction of the pulse laser beam.

As illustrated in FIG. 6, when the polarization direction of the pulse laser beam output from the oscillator 10 and the transmission axis of the polarizer 53 are orthogonal to each other, all components of the pulse laser beam are reflected and are propagated through the delay optical path in the OPS 51. When the polarization direction of the pulse laser beam output from the oscillator 10 and the transmission axis of the polarizer 53 are parallel to each other, all components of the pulse laser beam are transmitted and are not propagated through the delay optical path in the OPS 51 so that stretching of a pulse width and change of a pulse waveform cannot be performed.

While the component of the pulse laser beam transmitted through the polarizer 53 passes through the OPS 51 and the component of the pulse laser beam reflected by the polarizer 53 is propagated through the delay optical path in OPS 51 in FIG. 6, the component of the pulse laser beam transmitted through the polarizer 53 may be propagated through the delay optical path in the OPS 51, and the component of the pulse laser beam reflected by the polarizer 53 may pass through the OPS 51.

For the pulse laser beam reflected by the polarizer 53, the concave mirror 54a, and the concave mirror 54b, the polarization direction is rotated by the Faraday rotator 91. The pulse laser beam having the rotated polarization direction returns to the polarizer 53, and the component parallel to the transmission axis of the polarizer 53 is transmitted and is propagated through the delay optical path in the OPS 51 again. The component orthogonal to the transmission axis of the polarizer 53 is reflected and passes through the OPS 51.

It should be noted that a term "orthogonal" or "perpendicular" in the present specification, unless clearly described, is not limited to a case of being strictly orthogonal or perpendicular, and includes a concept of being substantially orthogonal or substantially perpendicular including a range of an angle difference that is practically allowable without losing technical significance, except for a case of being clear from context. In addition, a term "parallel" in the present specification, unless clearly described, is not limited to a case of being strictly parallel, and includes a concept of being substantially parallel including a range of an angle difference that is practically allowable without losing technical significance, except for a case of being clear from context.

The OPS control unit 72 may control the actuator 120 of the Faraday rotator 91 to change the rotation amount in the polarization direction. The OPS control unit 72 may control the actuator 120 so as to change the polarization direction by moving the Faraday material 95 in the optical axis direction by a predetermined moving amount, and may determine the rotation amount of the Faraday rotator 91 based on the measurement result of the photosensor 63 for each position of the Faraday material 95.

The concave mirrors 54a, 54b, 54c, and 54d forming the delay optical path of the OPS 51 are an example of "delay optical system" in the present disclosure. The concave mirrors 54a, 54b, 54c, and 54d are an example of "plurality of mirrors" in the present disclosure.

3.3 Example 1 of Control Flow

Figure 7:
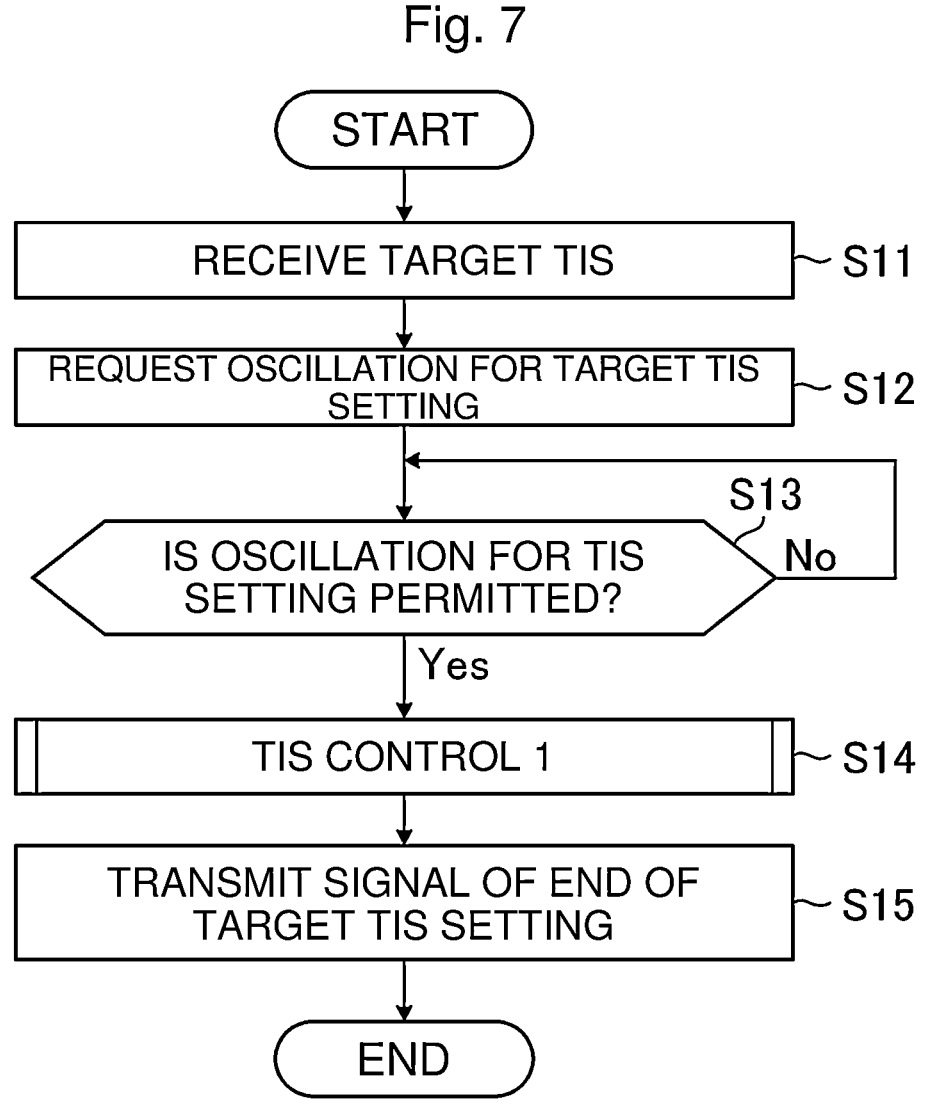
FIG. 7 is a flowchart illustrating Example 1 of control processing in a laser apparatus according to Embodiment 1.

FIG. 7 is a flowchart illustrating Example 1 of control processing in the laser apparatus 2A according to Embodiment 1. FIG. 7 illustrates a flow in which the OPS control unit 72 acquires a pulse waveform from the photosensor 63, calculates a pulse width (TIS), and controls the Faraday rotator 91 such that the TIS satisfies a target.

In step S11, the OPS control unit 72 receives a target TIS. The target TIS may be received from, for example, a processing apparatus or an exposure apparatus which is not illustrated.

Thereafter, in step S12, the OPS control unit 72 issues a request for oscillation for target TIS setting.

In step S13, the OPS control unit 72 determines whether or not the oscillation for TIS setting is permitted. When a determination result in step S13 is No determination, the OPS control unit 72 repeats step S13.

When the determination result in step S13 is Yes determination, the OPS control unit 72 proceeds to step S14. In step S14, the OPS control unit 72 performs first TIS control. In the drawings, for example, the first TIS control is referred to as "TIS control 1". A subroutine of the first TIS control applied to step S14 will be described later with reference to FIG. 8.

In step S15 after step S14, the OPS control unit 72 transmits a signal indicating an end of the target TIS setting.

After step S15, the OPS control unit 72 ends the flowchart in FIG. 7.

Figure 8:
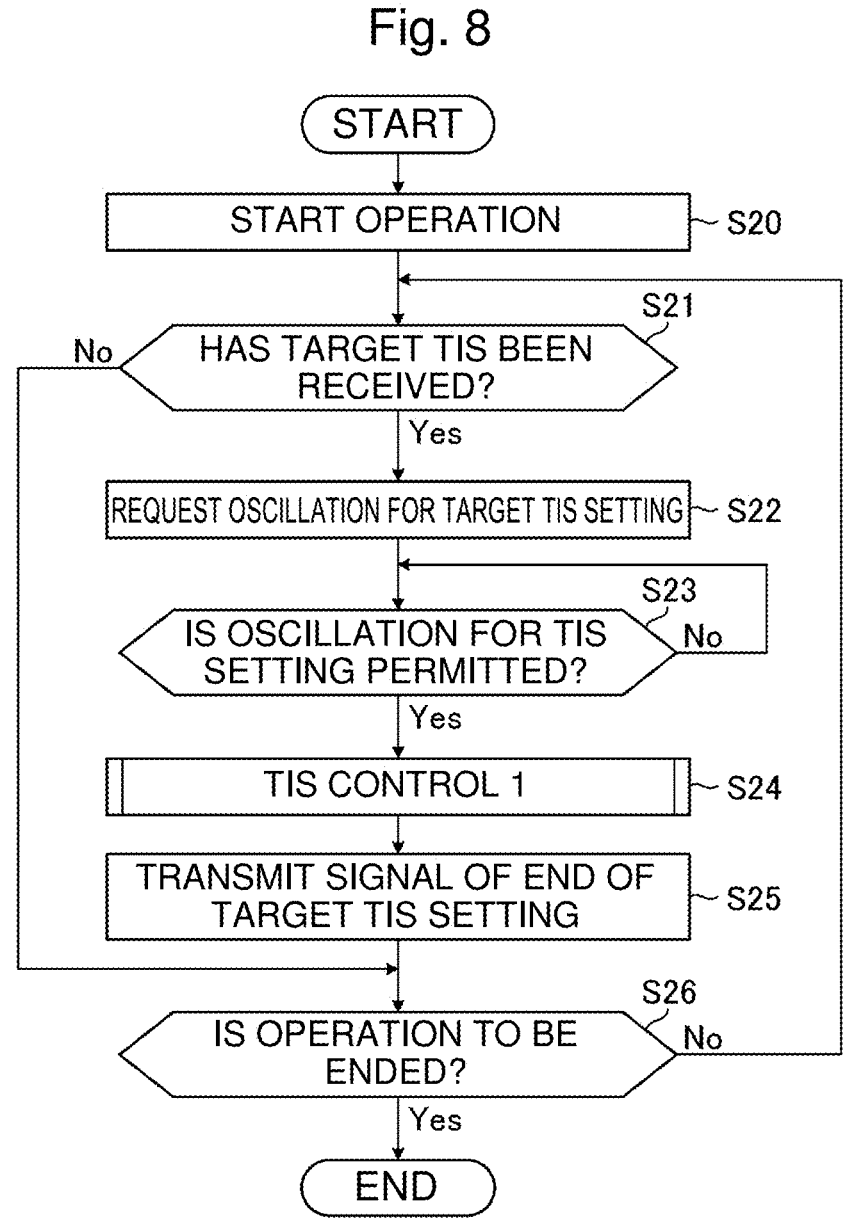
FIG. 8 is a flowchart illustrating Example 2 of control processing in a laser apparatus according to Embodiment 1.

FIG. 8 is a flowchart illustrating Example 2 of the control processing in the laser apparatus 2A according to Embodiment 1. The flowchart illustrated in FIG. 8 may be executed, for example, after the flowchart in FIG. 7 is ended.

In step S20, the laser control unit 70 starts an operation of the laser apparatus 2A.

In step S21, the OPS control unit 72 determines whether or not the target TIS has been received. When a determination result in step S21 is Yes determination, the OPS control unit 72 proceeds to step S22. The respective steps from step S22 to step S25 may be similar to the corresponding steps from step S12 to step S15 in FIG. 7, and redundant description will be omitted.

In step S26 after step S25, the laser control unit 70 determines whether or not to end the operation of the laser apparatus 2A. When a determination result in step S26 is No determination, the processing returns to step S21.

When the determination result in step S21 is No determination, the OPS control unit 72 proceeds to step S26.

When the determination result in step S26 is Yes determination, the laser control unit 70 stops the laser apparatus 2A and ends the flowchart in FIG. 8.

Figure 9:
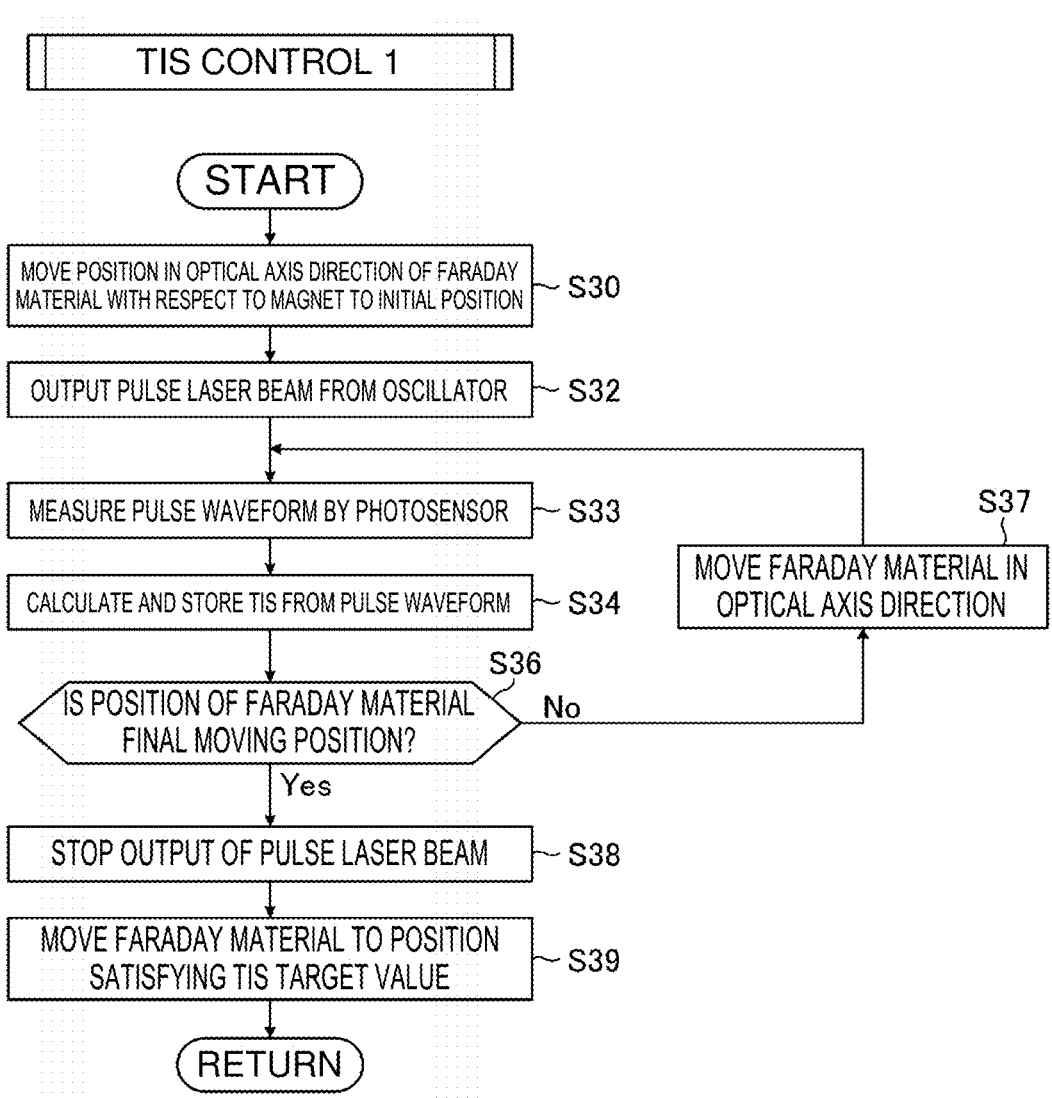
FIG. 9 is a flowchart illustrating an example of a subroutine applied to step S14 in FIG. 7 or step S24 in FIG. 8.

FIG. 9 is a flowchart illustrating an example of a subroutine applied to step S14 in FIG. 7 or step S24 in FIG. 8.

When the flowchart in FIG. 9 is started, in step S30, the OPS control unit 72 moves a position in the optical axis direction of the Faraday material 95 with respect to the magnet 96 to an initial position. The position in the optical axis direction of the Faraday material 95 is defined by, for example, a center position of the Faraday material 95. The initial position of the Faraday material 95 may be, for example, a center position of the magnet 96.

Next, in step S32, the OPS control unit 72 causes the oscillator 10 to output a pulse laser beam.

In step S33, the OPS control unit 72 measures a pulse waveform by the photosensor 63.

Then, in step S34, the OPS control unit 72 calculates a TIS from the measured pulse waveform, and stores a value of the calculated TIS in association with the position of the Faraday material 95.

Thereafter, in step S36, the OPS control unit 72 determines whether or not the position of the Faraday material 95 is a final moving position. When a determination result in step S36 is No determination, the OPS control unit 72 proceeds to step S37 to move the Faraday material 95 in the optical axis direction. The moving amount at the time may be a predetermined moving amount such as 0.5 mm. After step S37, the processing returns to step S33.

When the determination result in step S36 is Yes determination, the OPS control unit 72 proceeds to step S38.

In step S38, the OPS control unit 72 stops output of the pulse laser beam.

Thereafter, in step S39, the OPS control unit 72 moves the Faraday material 95 to a position satisfying a target value (the target TIS) of the TIS. Instead of step S39, the OPS control unit 72 may move the Faraday material 95 to a position where the TIS is the longest. The OPS control unit 72 controls the actuator 120 so that the TIS becomes equal to or greater than the target value.

After step S39, the OPS control unit 72 ends the flowchart in FIG. 9 and returns to the flowchart in FIG. 7 or FIG. 8.

3.4 Example 2 of Control Flow

FIG. 10 is a flowchart illustrating a modification of TIS control in the laser apparatus 2A according to Embodiment 1. The flowchart in FIG. 10 is an example of a method in which table data describing a relationship between the TIS and the position of the Faraday material 95 is created in advance and the Faraday rotator 91 is controlled based on the table data.

In step S40, the OPS control unit 72 performs processing of creating and storing the table data. A subroutine of the processing applied to step S40 will be described later with reference to FIG. 11.

After step S40, in step S41, the OPS control unit 72 transmits an oscillation ready signal.

In step S42, the laser control unit 70 starts the operation of the laser apparatus 2A. The respective steps from step S43 to step S48 may be similar to the corresponding steps from step S21 to step S26 in FIG. 8. However, instead of step S24 in FIG. 8, FIG. 10 includes step S46.

In step S46, the OPS control unit 72 performs second TIS control. A subroutine of the second TIS control applied to step S46 will be described later with reference to FIG. 12.

Figure 11:
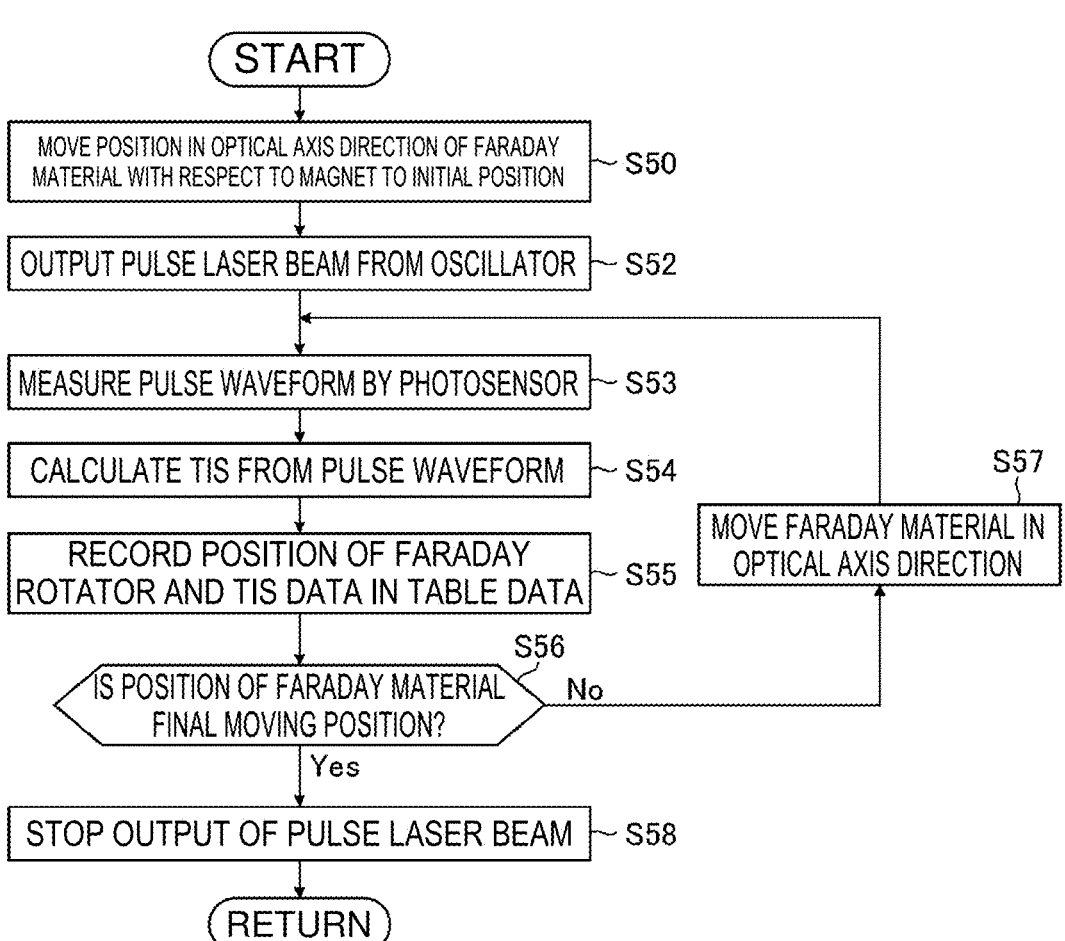
FIG. 11 is a flowchart illustrating an example of a subroutine of processing applied to step S40 in FIG. 10.

FIG. 11 is a flowchart illustrating an example of a subroutine of the processing applied to step S40 in FIG. 10.

When the flowchart in FIG. 11 is started, in step S50, the OPS control unit 72 moves the position in the optical axis direction of the Faraday material 95 with respect to the magnet 96 to the initial position. The respective steps from step S50 to step S54 may be similar to the corresponding steps from step S30 to step S34 in FIG. 9.

In step S55 after step S54, the OPS control unit 72 records the position of the Faraday material 95 and TIS data in the table data.

Thereafter, in step S56, the OPS control unit 72 determines whether or not the position of the Faraday material 95 is the final moving position. The respective steps from step S56 to step S58 may be similar to the corresponding steps from step S36 to step S38 in FIG. 9.

By repeating a loop from step S53 to step S57, the table data indicating the relationship between the position of the Faraday material 95 and the TIS is acquired. Since the position of the Faraday material 95 corresponds to a control amount of the actuator 120, the table data may define a relationship between the TIS and the control amount of the actuator 120.

After step S58, the OPS control unit 72 ends the flowchart in FIG. 11 and returns to the flowchart in FIG. 10.

Figure 12:
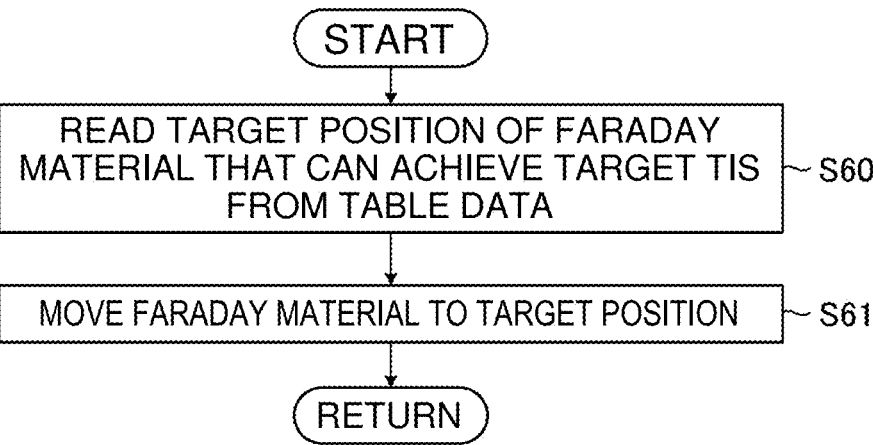
FIG. 12 is a flowchart illustrating an example of a subroutine of processing applied to step S46 in FIG. 10.

FIG. 12 is a flowchart illustrating an example of a subroutine of the processing applied to step S46 in FIG. 10. When the flowchart in FIG. 12 is started, in step S60, the OPS control unit 72 reads a target position of the Faraday material 95 that can achieve the target TIS from the table data.

Then, in step S61, the OPS control unit 72 drives the actuator 120 so as to move the Faraday material 95 to the target position.

After step S61, the OPS control unit 72 ends the flowchart in FIG. 12 and returns to the flowchart in FIG. 10.

3.5 Effect

By the OPS 51 according to Embodiment 1, change to any pulse width (TIS) is possible without changing components of the optical system, such as changing the circulating optical path length or changing optical components. Further, by the OPS 51 according to Embodiment 1, it is possible to satisfy the target value of the pulse width (TIS) without changing the components of the optical system.

3.6 Modification 1

3.6.1 Configuration

Figure 13:
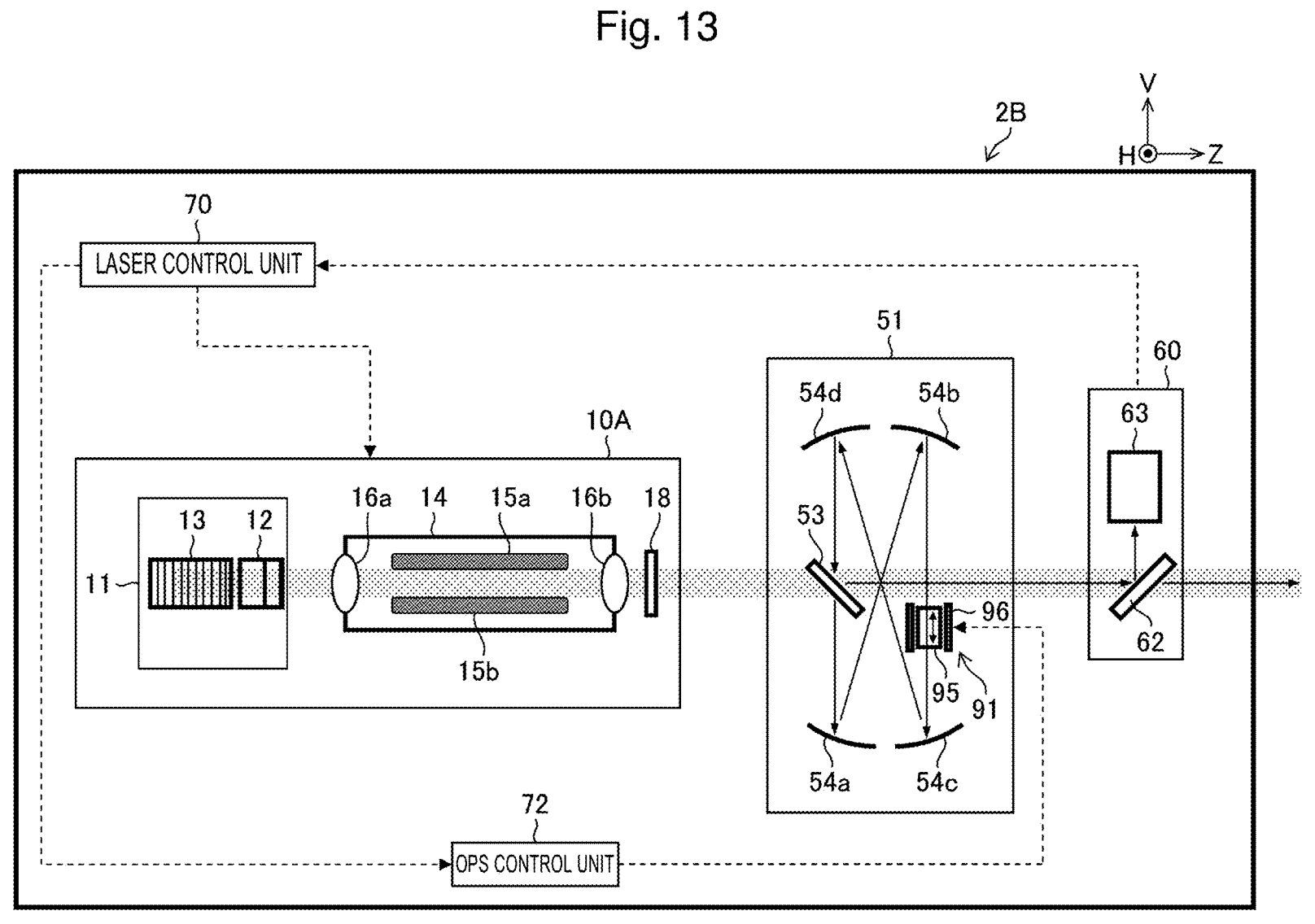

FIG. 13 schematically illustrates a configuration of a laser apparatus 2B according to Modification 1 of Embodiment 1. The configuration illustrated in FIG. 13 will be described in terms of differences from the configuration illustrated in FIG. 3.

An oscillator 10A of the laser apparatus 2B includes a line narrowing module (LNM) 11 instead of the rear mirror 17 in FIG. 3. The LNM 11 includes a prism beam expander 12 for narrowing a spectral linewidth, and a grating 13. The prism beam expander 12 and the grating 13 are disposed in Littrow arrangement in which an incident angle and a diffracting angle coincide with each other. The LNM 11 is an example of "line narrowing optical system" in the present disclosure.

The output coupling mirror 18 is a reflective mirror having a reflectance of 40% to 60%. The output coupling mirror 18 and the LNM 11 are arranged to configure an optical resonator.

3.6.2 Operation

Based on control by the laser control unit 70, a high voltage pulse is applied between the discharge electrodes 15a and 15b in the chamber 14 from an unillustrated power supply. When discharge occurs between the discharge electrodes 15a and 15b in the chamber 14, a laser gas is excited, and a pulse laser beam having a line-narrowed wavelength being an ultraviolet wavelength from 150 nm to 380 nm is output from the output coupling mirror 18 by the optical resonator configured by the output coupling mirror 18 and the LNM 11. The remaining operation is the same as the operation of the laser apparatus 2A according to Embodiment 1 described with reference to FIG. 3.

3.6.3 Effect

By the laser apparatus 2B according to Modification 1 of Embodiment 1, it is possible to stretch the pulse width and change the pulse waveform of the pulse laser beam having a line-narrowed ultraviolet wavelength.

Further, according to the laser apparatus 2B, it is possible to change the pulse laser beam having a line-narrowed ultraviolet wavelength into any pulse width and pulse waveform without changing the components of the optical system.

3.7 Modification 2

3.7.1 Configuration

Figure 14:
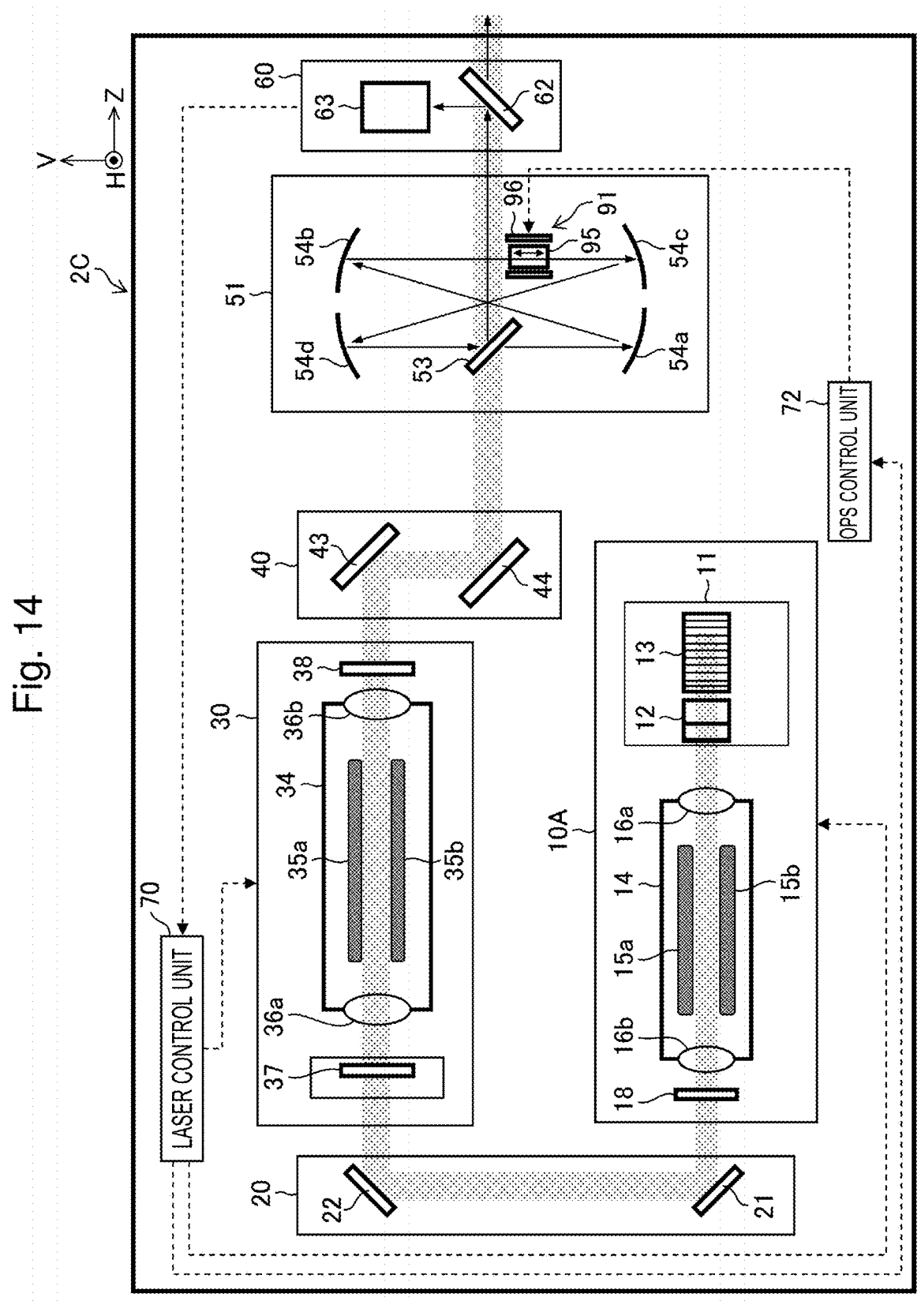
FIG. 14 schematically illustrates a configuration of a laser apparatus according to Modification 2 of Embodiment 1.

FIG. 14 schematically illustrates a configuration of a laser apparatus 2C according to Modification 2 of Embodiment 1. The configuration illustrated in FIG. 14 will be described in terms of differences from the configuration illustrated in FIG. 3.

In the laser apparatus 2C, a part of the oscillator 10 in FIG. 3 is configured by a system of an MOPO (Master Oscillator Power Oscillator) type including an oscillation stage laser 10A and an amplification stage laser 30. A MO beam steering unit 20 is disposed between the oscillation stage laser 10A and the amplification stage laser 30, and a PO beam steering unit 40 is disposed between the amplification stage laser 30 and the OPS 51.

The oscillation stage laser 10A includes the LNM 11, the chamber 14, and the output coupling mirror 18. The configuration of the oscillation stage laser 10A may be the same as that of the oscillator 10A described with reference to FIG. 13.

The MO beam steering unit 20 includes a high reflective mirror 21 and a high reflective mirror 22, and is disposed so that a pulse laser beam output from the oscillation stage laser 10A enters the amplification stage laser 30.

The amplification stage laser 30 includes a chamber 34, a rear mirror 37, and an output coupling mirror 38. The output coupling mirror 38 and the rear mirror 37 configure an optical resonator, and the chamber 34 is disposed on an optical path of the optical resonator. The amplification stage laser 30 is an example of "amplifier" in the present disclosure.

A configuration of the chamber 34 may be the same as that of the chamber 14. The chamber 34 includes a pair of discharge electrodes 35a and 35b and two windows 36a and 36b, and an excimer laser gas is introduced into the chamber 34.

The rear mirror 37 may be a partial reflection mirror having a reflectance of 50% to 90%. The output coupling mirror 38 may be a partial reflection mirror having a reflectance of 10% to 30%.

The PO beam steering unit 40 includes a high reflective mirror 43 and a high reflective mirror 44, and is disposed so that a pulse laser beam output from the amplification stage laser 30 enters the OPS 51.

3.7.2 Operation

Based on control by the laser control unit 70, a high voltage pulse is applied between the discharge electrodes 15a and 15b in the chamber 14 from an unillustrated power supply. When discharge occurs between the discharge electrodes 15a and 15b in the chamber 14, a laser gas is excited, and a pulse laser beam having a line-narrowed wavelength being an ultraviolet wavelength from 150 nm to 380 nm is output from the output coupling mirror 18 by the optical resonator configured by the output coupling mirror 18 and the LNM 11.

The pulse laser beam output from the output coupling mirror 18 enters the rear mirror 37 of the amplification stage laser 30 as seed light via the MO beam steering unit 20. The pulse laser beam output from the output coupling mirror 18 is an example of "first pulse laser beam" in the present disclosure.

At timing when the seed light transmitted through the rear mirror 37 enters the chamber 34, a high voltage pulse is applied between the discharge electrodes 35a and 35b in the chamber 34 from an unillustrated power supply. When discharge occurs between the discharge electrodes 35a and 35b in the chamber 34, a laser gas is excited, the seed light is amplified by a Fabry-Perot optical resonator configured by the output coupling mirror 38 and the rear mirror 37, and an amplified pulse laser beam is output from the output coupling mirror 38.

The pulse laser beam output from the amplification stage laser 30 enters the OPS 51 via the PO beam steering unit 40. The operation of the OPS 51 is the same as that in Embodiment 1.

3.7.3 Effect

By the laser apparatus 2C according to Modification 2 of Embodiment 1, it is possible to stretch the pulse width and change the pulse waveform of the pulse laser beam having a line-narrowed ultraviolet wavelength and high energy.

Further, according to the laser apparatus 2C, it is possible to change the pulse laser beam having the line-narrowed ultraviolet wavelength and the high energy to any pulse width and pulse waveform without changing the components of the optical system.

4. EMBODIMENT 2

4.1 Configuration

Figure 15:
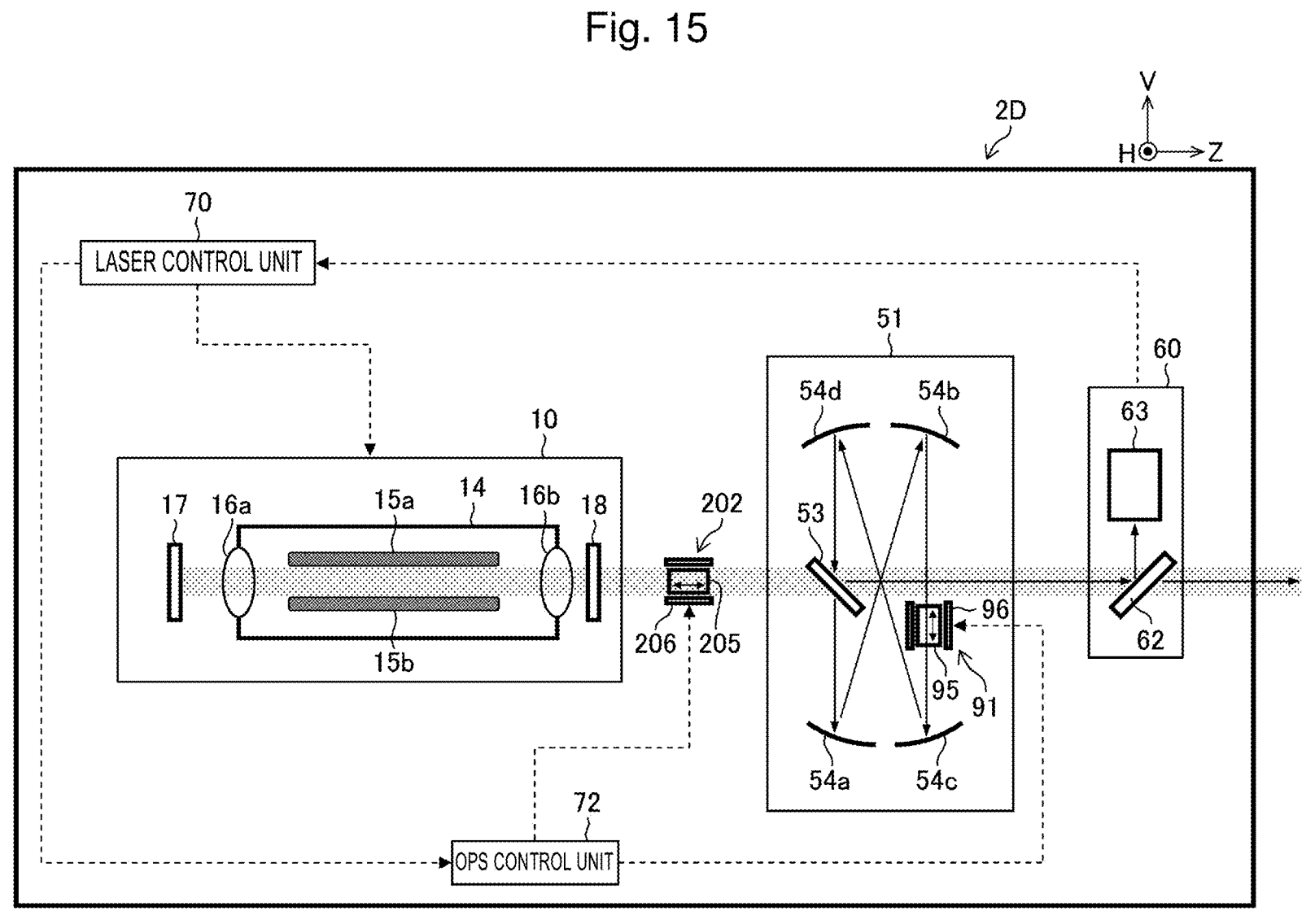

FIG. 15 schematically illustrates a configuration of a laser apparatus 2D according to Embodiment 2. The configuration illustrated in FIG. 15 will be described in terms of differences from the configuration illustrated in FIG. 3.

In the laser apparatus 2D, a Faraday rotator 202 is disposed upstream of the OPS 51. The Faraday rotator 202 includes a Faraday material 205 and a magnet 206. A structure of the Faraday rotator 202 may be the same as a structure of the Faraday rotator 91 described with reference to FIG. 4 and FIG. 5.

In the Faraday rotator 202, an unillustrated actuator that moves the Faraday material 205 with respect to the magnet 206 in the optical axis direction of the pulse laser beam is disposed. Hereinafter, for convenience of description, the Faraday rotator 91 disposed in the delay optical path of the OPS 51 will be referred to as a first Faraday rotator 91, and the Faraday rotator 202 disposed upstream of the OPS 51 will be referred to as a second Faraday rotator 202. In addition, the Faraday material 95, the magnet 96, and the actuator 120 of the first Faraday rotator 91 will be referred to as a first Faraday material 95, a first magnet 96, and a first actuator 120, and the Faraday material 205, the magnet 206, and the actuator of the second Faraday rotator 202 will be referred to as a second Faraday material 205, a second magnet 206, and a second actuator.

A maximum moving amount of the second Faraday material 205 by the second actuator is preferably half or more of a length in the optical axis direction of the pulse laser beam of the second Faraday material 205. A smallest moving unit of the second actuator may be, for example, about 0.2 mm. The second actuator may move the second magnet 206 with respect to the second Faraday material 205 in the optical axis direction of the pulse laser beam. The second actuator is an example of "second moving mechanism" in the present disclosure.

4.2 Operation

Figure 16:
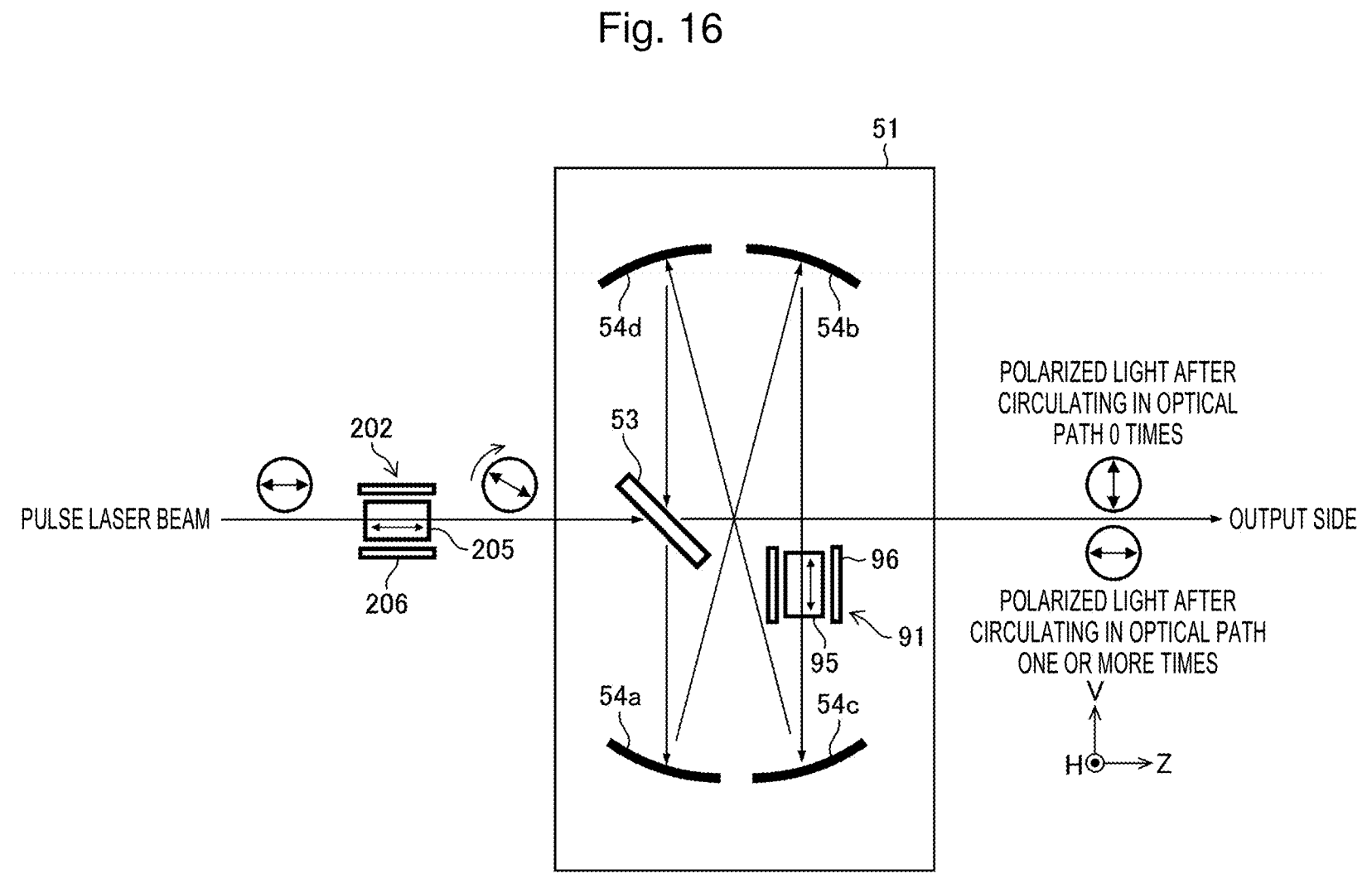

FIG. 16 is an explanatory diagram illustrating an example of a polarization direction of a pulse laser beam entering the second Faraday rotator 202 and a polarization direction of a pulse laser beam having passed through the OPS 51.

The polarization direction of the pulse laser beam polarized in a specific direction and output from the amplification stage laser 30 is rotated by the second Faraday rotator 202. FIG. 16 illustrates an example in which the polarization direction is rotated clockwise.

For the pulse laser beam having the rotated polarization direction, the component parallel to the transmission axis of the polarizer 53 is transmitted by the polarizer 53 and passes through the OPS 51. The component orthogonal to the transmission axis of the polarizer 53 is reflected by the polarizer 53 and is propagated through the delay optical path in the OPS 51.

While the component of the pulse laser beam transmitted through the polarizer 53 passes through the OPS 51 and the component of the pulse laser beam reflected by the polarizer 53 is propagated through the delay optical path in the OPS 51 in FIG. 16, the component of the pulse laser beam transmitted through the polarizer 53 may be propagated through the delay optical path in the OPS 51 and the component of the reflected pulse laser beam may pass through the OPS 51.

For the pulse laser beam reflected by the polarizer 53, the polarization direction is rotated by the first Faraday rotator 91 on the delay optical path in the OPS 51. The pulse laser beam having the polarization direction rotated by the first Faraday rotator 91 returns to the polarizer 53, and the component parallel to the transmission axis of the polarizer 53 is transmitted and is propagated through the delay optical path in the OPS 51 again. Of the pulse laser beam propagated through the delay optical path and returned to the polarizer 53, the component orthogonal to the transmission axis of the polarizer 53 is reflected and passes through the OPS 51.

According to the configuration in FIG. 16, the polarization direction of 0-circulation light which is transmitted through the polarizer 53 and is output from the OPS 51 without circulating in the delay optical path of the OPS 51 and the polarization direction of one-or-more-circulation light which is output from the OPS 51 after circulating in the delay optical path one or more times are different and the rotation amount of polarized light can be adjusted at two parts so that a degree of freedom in changing a pulse width or the like is further high as compared with the configuration of Embodiment 1.

The OPS control unit 72 may control the first actuator 120 of the first Faraday rotator 91 to change the rotation amount in the polarization direction. The OPS control unit 72 may control the second actuator of the second Faraday rotator 202 to change the rotation amount in the polarization direction.

The OPS control unit 72 may determine the rotation amount of the first Faraday rotator 91 based on a measurement result by the photosensor 63. The OPS control unit 72 may determine the rotation amount of the second Faraday rotator 202 based on a measurement result by the photosensor 63. The OPS control unit 72 may control the rotation amount of the second Faraday rotator 202 in order to change the waveform of a first half of the pulse waveform of the pulse laser beam output from the laser apparatus 2D. The OPS control unit 72 may control the rotation amount of the first Faraday rotator 91 in order to change the waveform of a second half of the pulse waveform of the pulse laser beam output from the laser apparatus 2D.

4.3 Example of Control Flow

Figure 17:
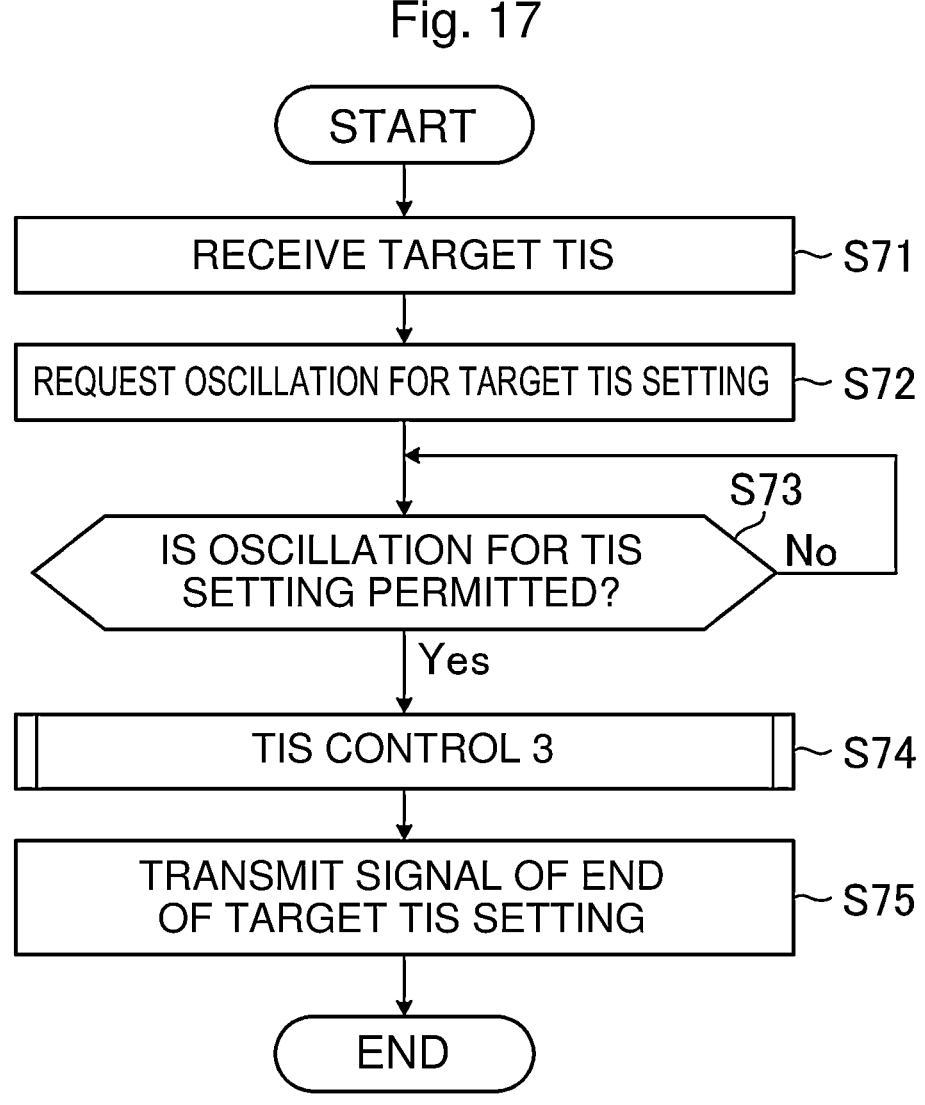
FIG. 17 is a flowchart illustrating an example of control processing in a laser apparatus according to Embodiment 2.

FIG. 17 is a flowchart illustrating an example of a control processing in the laser apparatus 2D according to Embodiment 2. The flowchart illustrated in FIG. 17 will be described in terms of differences from that illustrated in FIG. 7.

Step S71 to step S73 in FIG. 17 are similar to the corresponding steps that are step S11 to step S13 in FIG. 7. The flowchart in FIG. 17 includes step S74 instead of step S14 in FIG. 7.

When a determination result in step S73 is Yes determination, the OPS control unit 72 proceeds to step S74. In step S74, the OPS control unit 72 performs third TIS control. A subroutine of the third TIS control applied to step S74 will be described later with reference to FIG. 18.

Step S75 after step S74 is similar to step S15 in FIG. 7. After step S75, the OPS control unit 72 ends the flowchart in FIG. 17.

Figure 18:
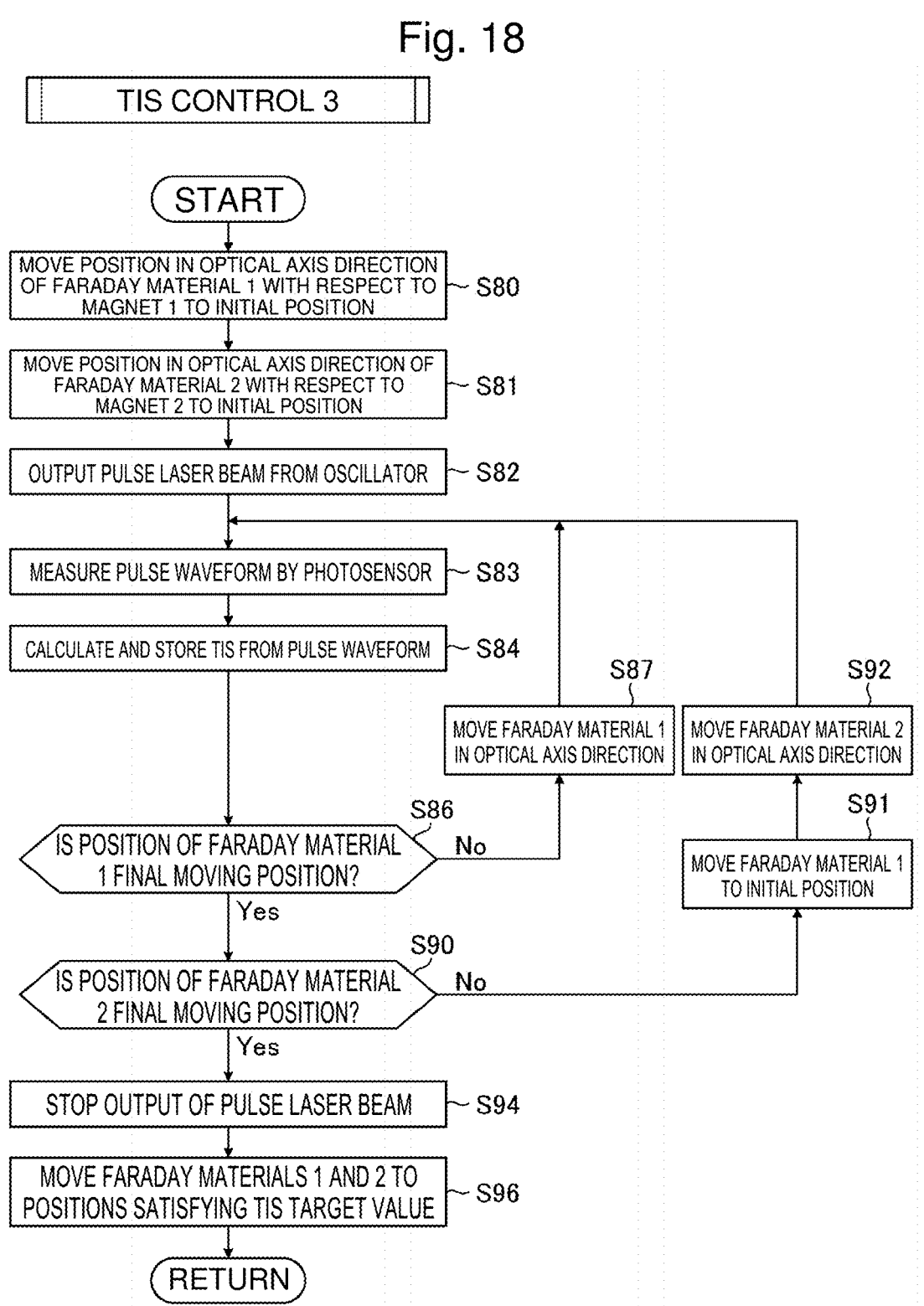
FIG. 18 is a flowchart illustrating an example of a subroutine of processing applied to step S74 in FIG. 17.

FIG. 18 is a flowchart illustrating an example of the third TIS control. The flowchart in FIG. 18 is an example of the subroutine of processing applied to step S74 in FIG. 17. In FIG. 18, for convenience of illustration, the first Faraday material 95 is referred to as "Faraday material 1", the first magnet 96 is referred to as "magnet 1", the second Faraday material 205 is referred to as "Faraday material 2", and the second magnet 206 is referred to as "magnet 2".

When the flowchart in FIG. 18 is started, in step S80, the OPS control unit 72 moves a position in the optical axis direction of the first Faraday material 95 with respect to the first magnet 96 to an initial position. Step S80 may be similar to step S30 in FIG. 9.

Next, in step S81, the OPS control unit 72 moves a position in the optical axis direction of the second Faraday material 205 with respect to the second magnets 206 to an initial position. The position in the optical axis direction of the second Faraday material 205 is defined by, for example, a center position of the second Faraday material 205. The initial position of the second Faraday material 205 may be, for example, a center position of the second magnet 206. After step S81, the OPS control unit 72 proceeds to step S82.

Next, in step S82, the OPS control unit 72 causes the oscillator 10 to output a pulse laser beam.

In step S83, the OPS control unit 72 measures a pulse waveform by the photosensor 63. Then, in step S84, the OPS control unit 72 calculates a TIS from the measured pulse waveform, and stores the value in association with the position of the first Faraday material 95 and the position of the second Faraday material 205.

Thereafter, in step S86, the OPS control unit 72 determines whether or not the position of the first Faraday material 95 is a final moving position. When a determination result in step S86 is No determination, the OPS control unit 72 proceeds to step S87 to move the first Faraday material 95 in the optical axis direction. Step S86 and step S87 are similar to step S36 and step S37 in FIG. 9. After step S87, the processing returns to step S83.

When the determination result in step S86 is Yes determination, the OPS control unit 72 proceeds to step S90. In step S90, the OPS control unit 72 determines whether or not the position of the second Faraday material 205 is a final moving position. When a determination result in step S90 is No determination, the OPS control unit 72 proceeds to step S91 to move the first Faraday material 95 to the initial position.

Thereafter, in step S92, the OPS control unit 72 moves the second Faraday material 205 in the optical axis direction. The moving amount at the time may be a predetermined moving amount such as 0.5 mm. After step S92, the processing returns to step S83.

When the determination result in step S90 is Yes determination, the OPS control unit 72 proceeds to step S94. In step S94, the OPS control unit 72 stops output of the pulse laser beam.

Thereafter, in step S96, the OPS control unit 72 moves the first Faraday material 95 and the second Faraday material 205 to positions satisfying a target value (the target TIS) of the TIS. Instead of step S96, the OPS control unit 72 may move the first Faraday material 95 and the second Faraday material 205 to positions where the TIS is the longest.

After step S96, the OPS control unit 72 ends the flowchart in FIG. 18 and returns to the flowchart in FIG. 17.

Without being limited to the flowcharts described in FIG. 17 and FIG. 18, as in the example described in FIG. 10 and FIG. 11, table data describing a relationship between the TIS and the position of the first Faraday material 95 and the position of the second Faraday material 205 may be created in advance and the first Faraday rotator 91 and the second Faraday rotator 202 may be controlled based on the table data.

4.4 Effect

According to Embodiment 2, it is possible to stretch the pulse width and change the pulse waveform of the pulse laser beam without changing the components of the optical system such as changing a circulating optical path length or changing an optical component. Further, according to Embodiment 2, it is possible to satisfy the target value of the pulse width (TIS) without changing the components of the optical system.

When the polarization direction of the pulse laser beam entering the OPS 51 is orthogonal to the transmission axis of the polarizer 53, all components of the pulse laser beam are reflected by the polarizer 53 and are propagated through the delay optical path. Then, only the component of the pulse laser beam orthogonal to the transmission axis of the polarizer 53 is reflected by the polarizer 53 and passes through the OPS 51. Therefore, the pulse laser beam transmitted through the OPS 51 is only the component orthogonal to the transmission axis of the polarizer 53 (polarization purity is high). The configuration of Embodiment 2 can be applied to applications requiring the high polarization purity, such as a light source for an exposure apparatus.

4.5 Modification 1

4.5.1 Configuration

Figure 19:
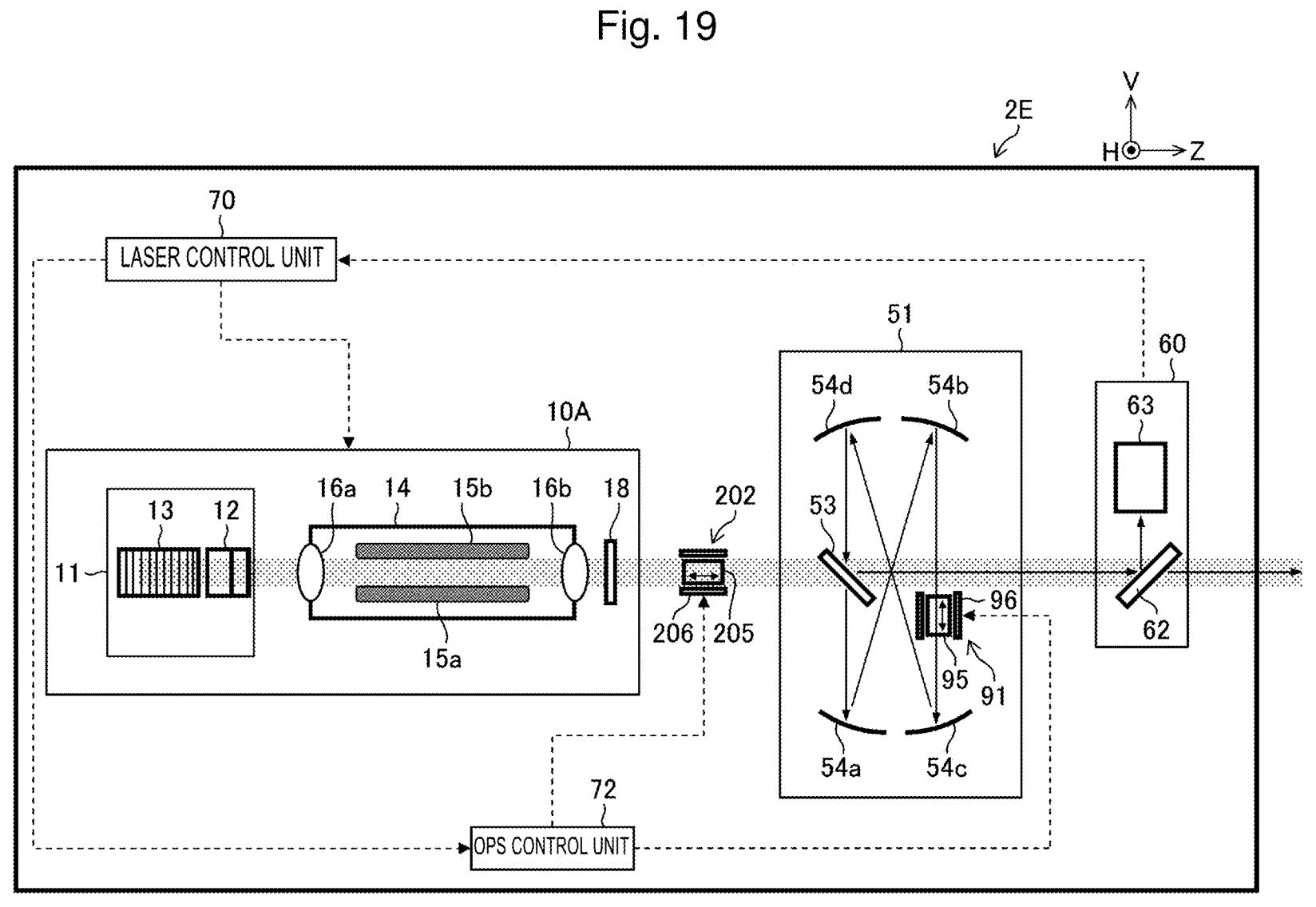

FIG. 19 schematically illustrates a configuration of a laser apparatus 2E according to Modification 1 of Embodiment 2. The configuration illustrated in FIG. 19 will be described in terms of differences from the configuration illustrated in FIG. 15.

The oscillator 10A of the laser apparatus 2E includes the LNM 11 instead of the rear mirror 17 in FIG. 15. The configuration of the LNM 11 may be similar to that in FIG. 13.

4.5.2 Operation

An operation of the oscillator 10A of the laser apparatus 2E is similar to that of the oscillator 10A in FIG. 13. The remaining operation is the same as the operation of the laser apparatus 2D according to Embodiment 2 described with reference to FIG. 15.

4.5.3 Effect

By the laser apparatus 2E according to Modification 1 of Embodiment 2, it is possible to stretch the pulse width and change the pulse waveform of the pulse laser beam having a line-narrowed ultraviolet wavelength.

Further, according to the laser apparatus 2E, it is possible to change the pulse laser beam having the line-narrowed ultraviolet wavelength to any pulse width and pulse waveform without changing the components of the optical system.

4.6 Modification 2

4.6.1 Configuration

Figure 20:
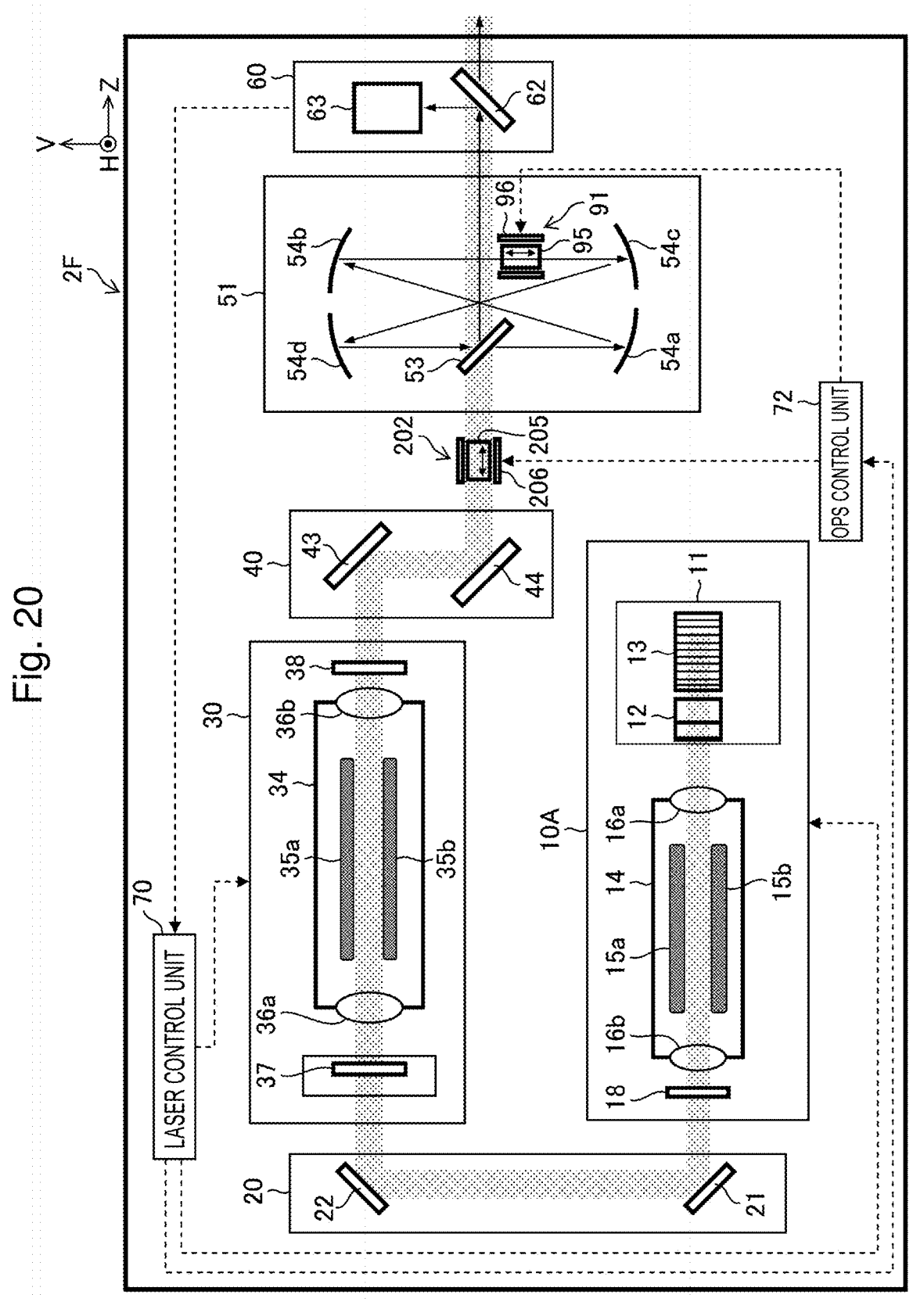
FIG. 20 schematically illustrates a configuration of a laser apparatus according to Modification 2 of Embodiment 2.

FIG. 20 schematically illustrates a configuration of a laser apparatus 2F according to Modification 2 of Embodiment 2. The configuration illustrated in FIG. 20 will be described in terms of differences from the configuration illustrated in FIG. 15.

In the laser apparatus 2F, the part of the oscillator 10A in FIG. 19 is configured by a system of an MOPO (Master Oscillator Power Oscillator) type including the oscillation stage laser 10A and the amplification stage laser 30. The MO beam steering unit 20 is disposed between the oscillation stage laser 10A and the amplification stage laser 30, and the PO beam steering unit 40 is disposed between the amplification stage laser 30 and the OPS 51.

The configurations of the oscillation stage laser 10A, the MO beam steering unit 20, the amplification stage laser 30, and the PO beam steering unit 40 may be similar to those in FIG. 14.

4.6.2 Operation

An operation of the laser apparatus 2F is similar to the operation of the laser apparatus 2C.

4.6.3 Effect

By the laser apparatus 2F according to Modification 2 of Embodiment 2, it is possible to stretch the pulse width and change the pulse waveform of the pulse laser beam having a line-narrowed ultraviolet wavelength and high energy.

Further, according to the laser apparatus 2F, it is possible to change the pulse laser beam having the line-narrowed ultraviolet wavelength and the high energy to any pulse width and pulse waveform without changing the components of the optical system.

5. MODIFICATION OF LASER APPARATUS

Without being limited to the configuration of the oscillation stage laser 10A illustrated in FIG. 14 and FIG. 19, for example, a solid-state laser system including a semiconductor laser and a wavelength conversion system may be employed. The wavelength conversion system may be configured using a nonlinear optical crystal. That is, an oscillation stage laser is not limited to a gas laser, and may be an ultraviolet solid-state laser that outputs a pulse laser beam having an ultraviolet wavelength. For example, the oscillation stage laser may be a solid-state laser that oscillates at a wavelength of about 193.4 nm, or an ultraviolet solid-state laser that outputs fourth harmonic light of a titanium-sapphire laser (wavelength of about 774 nm).

An amplifier is not limited to a configuration including a Fabry-Perot resonator such as the amplification stage laser 30 illustrated in FIG. 14, and may be a configuration including a ring resonator. Further, the amplifier is not limited to a configuration including an optical resonator, and may be a simple amplifier such as an excimer amplifier. The amplifier may be a multi-pass amplifier such as a three-pass amplifier that performs amplification by reflecting seed light by a cylindrical mirror and making the seed light pass through a discharge space three times.

6. ELECTRONIC DEVICE MANUFACTURING METHOD

Figure 21:
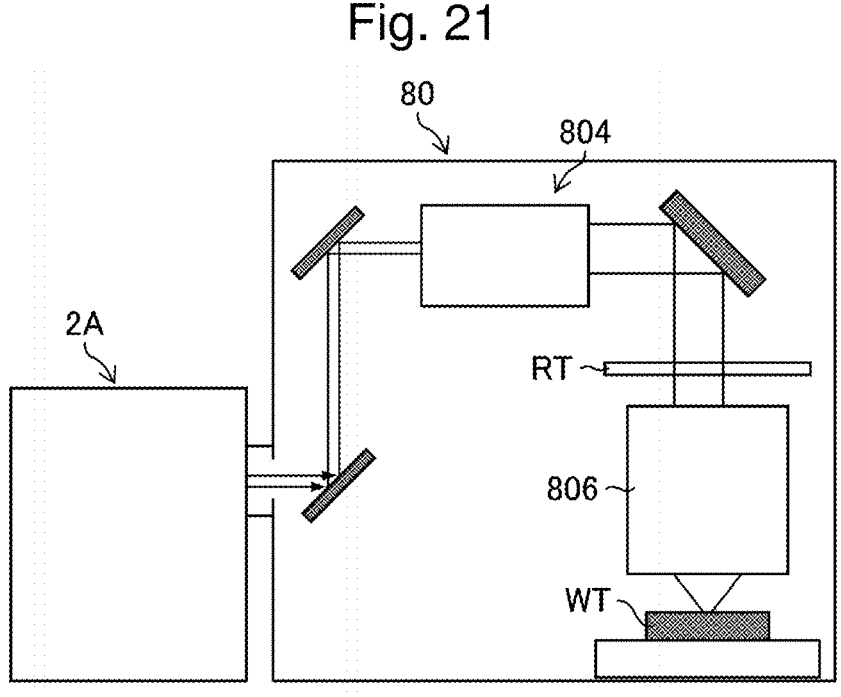
FIG. 21 schematically illustrates a configuration example of an exposure apparatus.

FIG. 21 schematically illustrates a configuration example of an exposure apparatus 80. The exposure apparatus 80 includes an illumination optical system 804 and a projection optical system 806. The laser apparatus 2A generates a laser beam and outputs the laser beam to the exposure apparatus 80. The illumination optical system 804 illuminates a reticle pattern of an unillustrated reticle disposed on a reticle stage RT with the laser beam which has entered from the laser apparatus 2A. The projection optical system 806 performs reduction projection of the laser beam transmitted through the reticle and forms an image on an unillustrated workpiece disposed on a workpiece table WT. The workpiece is a photosensitive substrate such as a semiconductor wafer on which photoresist is applied.

The exposure apparatus 80 synchronously translates the reticle stage RT and the workpiece table WT to expose the workpiece to the laser beam reflecting the reticle pattern. After the reticle pattern is transferred onto the semiconductor wafer by an exposure process described above, a semiconductor device can be manufactured through a plurality of processes. The semiconductor device is an example of "electronic device" in the present disclosure. Without being limited to the laser apparatus 2A, the laser apparatuses 2B-2F or the like may be used.

7. OTHERS

The description above is intended to be illustrative and the present disclosure is not limited thereto. Therefore, it would be obvious to those skilled in the art that modifications to the embodiments of the present disclosure would be possible without departing from the scope of the claims. Further, it would be also obvious for those skilled in the art that the embodiments of the present disclosure would be appropriately combined.

The terms used throughout the present specification and the claims should be interpreted as non-limiting terms unless clearly described. For example, terms such as "comprise", "include", "have", and "contain" should not be interpreted to be exclusive of other structural elements. Further, indefinite articles "a/an" should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. An optical pulse stretcher that stretches a pulse width of a pulse laser beam, the optical pulse stretcher comprising:
   a polarizer configured to separate a component in a specific polarization direction of the pulse laser beam that has entered;
   a delay optical system including a plurality of mirrors that are configured such that the pulse laser beam reflected by or transmitted through the polarizer passes through a delay optical path, through which the pulse laser beam is propagated to return to the polarizer, a plurality of times; and
   a first Faraday rotator that includes a first magnet and a first Faraday material and is disposed on the delay optical path of the delay optical system to rotate a polarization direction of the pulse laser beam.

2. The optical pulse stretcher according to claim 1, further comprising:
   a first actuator capable of changing a rotation amount in the polarization direction of the pulse laser beam in the first Faraday rotator; and
   a processor configured to control the first actuator.

3. The optical pulse stretcher according to claim 2, wherein
   the first actuator is a first moving mechanism configured to change a position in an optical axis direction of the pulse laser beam of the first Faraday material with respect to the first magnet.

4. The optical pulse stretcher according to claim 1, further comprising
   a second Faraday rotator that includes a second magnet and a second Faraday material and is configured to rotate the polarization direction of the pulse laser beam entering the polarizer.

5. The optical pulse stretcher according to claim 4, further comprising:
   a first actuator capable of changing a rotation amount in the polarization direction of the pulse laser beam in the first Faraday rotator;
   a second actuator capable of changing a rotation amount in the polarization direction of the pulse laser beam in the second Faraday rotator; and
   a processor configured to control the first actuator and the second actuator.

6. The optical pulse stretcher according to claim 5, wherein
   the first actuator is a first moving mechanism configured to change a position in an optical axis direction of the pulse laser beam of the first Faraday material with respect to the first magnet, and
   the second actuator is a second moving mechanism configured to change a position in the optical axis direction of the pulse laser beam of the second Faraday material with respect to the second magnet.

7. The optical pulse stretcher according to claim 4, wherein
   each of the first Faraday material and the second Faraday material is calcium fluoride or synthetic quartz.

8. The optical pulse stretcher according to claim 1, wherein
   the polarization direction of the pulse laser beam entering the optical pulse stretcher and a transmission axis of the polarizer are orthogonal to each other.

9. The optical pulse stretcher according to claim 1, wherein
   the mirrors include four concave mirrors.

10. A laser apparatus comprising:
   an oscillator configured to output a pulse laser beam; and
   an optical pulse stretcher configured to stretch a pulse width of the pulse laser beam,
   the optical pulse stretcher including
      a polarizer configured to separate a component in a specific polarization direction of the pulse laser beam that has entered,
      a delay optical system including a plurality of mirrors that are configured such that the pulse laser beam reflected by or transmitted through the polarizer passes through a delay optical path, through which the pulse laser beam is propagated to return to the polarizer, a plurality of times; and
      a first Faraday rotator that includes a first magnet and a first Faraday material and is disposed on the delay optical path of the delay optical system to rotate a polarization direction of the pulse laser beam.

11. The laser apparatus according to claim 10, further comprising:
   a first actuator capable of changing a rotation amount in the polarization direction of the pulse laser beam; and
   a processor configured to control the first actuator.

12. The laser apparatus according to claim 11, wherein the first actuator is a first moving mechanism configured to change a position in an optical axis direction of the pulse laser beam of the first Faraday material with respect to the first magnet.

13. The laser apparatus according to claim 11, further comprising a photosensor configured to measure a pulse waveform of the pulse laser beam having passed through the optical pulse stretcher, wherein
   the processor calculates a pulse width from the pulse waveform, and controls the first actuator so that the pulse width becomes equal to or greater than a target value.

14. The laser apparatus according to claim 11, wherein
   the processor uses table data indicating a relationship between a pulse width of the pulse laser beam having passed through the optical pulse stretcher and a control amount of the first actuator to control the first actuator so that the pulse width is equal to or greater than a target value.

15. The laser apparatus according to claim 10, wherein
   the polarization direction of the pulse laser beam entering the optical pulse stretcher and a transmission axis of the polarizer are orthogonal to each other.

16. The laser apparatus according to claim 10, wherein
   the oscillator includes a line narrowing optical system configured to narrow a spectral linewidth of the pulse laser beam having an ultraviolet wavelength.

17. The laser apparatus according to claim 10, wherein the oscillator includes:

an oscillation stage laser configured to output a first pulse laser beam having an ultraviolet wavelength; and an amplifier configured to amplify and output the first pulse laser beam output from the oscillation stage laser.

18. The laser apparatus according to claim 10, further comprising a second Faraday rotator that includes a second magnet and a second Faraday material and is configured to rotate the polarization direction of the pulse laser beam entering the optical pulse stretcher.

19. The laser apparatus according to claim 18, further comprising:

a first actuator capable of changing a rotation amount in the polarization direction of the pulse laser beam in the first Faraday rotator;

a second actuator capable of changing a rotation amount in the polarization direction of the pulse laser beam in the second Faraday rotator; and a processor configured to control the first actuator and the second actuator.

20. An electronic device manufacturing method comprising:

generating a laser beam having a stretched pulse width with a laser apparatus, the laser apparatus including an oscillator configured to output a pulse laser beam, and an optical pulse stretcher configured to stretch a pulse width of the pulse laser beam, the optical pulse stretcher including a polarizer configured to separate a component in a specific polarization direction of the pulse laser beam that has entered, a delay optical system including a plurality of mirrors that are configured such that the pulse laser beam reflected by or transmitted through the polarizer passes through a delay optical path, through which the pulse laser beam is propagated to return to the polarizer, a plurality of times; and a first Faraday rotator that includes a first magnet and a first Faraday material and is disposed on the delay optical path of the delay optical system to rotate a polarization direction of the pulse laser beam;

outputting the laser beam to an exposure apparatus; and exposing a photosensitive substrate to the laser beam in the exposure apparatus to manufacture an electronic device.

\* \* \* \* \*